(12) United States Patent
Uchida et al.

(10) Patent No.: US 9,464,849 B2
(45) Date of Patent: Oct. 11, 2016

(54) COOLING DEVICE USING LOOP TYPE HEAT PIPE

(71) Applicant: FUJITSU LIMITED, Kawasaki-shi, Kanagawa (JP)

(72) Inventors: Hiroki Uchida, Isehara (JP); Susumu Ogata, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 336 days.

(21) Appl. No.: 13/893,600

(22) Filed: May 14, 2013

(65) Prior Publication Data

US 2013/0312939 A1 Nov. 28, 2013

(30) Foreign Application Priority Data

May 14, 2012 (JP) .................................. 2012-110917
Jan. 10, 2013 (JP) .................................. 2013-002624

(51) Int. Cl.
| | |
|---|---|
| F28D 15/04 | (2006.01) |
| H01L 23/427 | (2006.01) |
| F28D 15/02 | (2006.01) |
| G06F 1/20 | (2006.01) |

(52) U.S. Cl.
CPC ............ *F28D 15/04* (2013.01); *F28D 15/0266* (2013.01); *F28D 15/046* (2013.01); *G06F 1/20* (2013.01); *H01L 23/427* (2013.01); *H01L 2924/0002* (2013.01)

(58) Field of Classification Search
CPC .. F28D 15/0266; F28D 15/04; F28D 15/043; H01L 23/427
USPC .................................................. 165/104.26
See application file for complete search history.

(56) References Cited

U.S. PATENT DOCUMENTS

| | | | | |
|---|---|---|---|---|
| 5,761,037 | A | * | 6/1998 | Anderson et al. ............. 361/700 |
| 6,450,132 | B1 | * | 9/2002 | Yao et al. ................. 165/104.26 |
| 6,981,543 | B2 | * | 1/2006 | Chesser et al. .......... 165/104.26 |
| 2010/0163212 | A1 | * | 7/2010 | Chin ........................ 165/104.26 |

FOREIGN PATENT DOCUMENTS

| | | |
|---|---|---|
| CN | 1703142 A | 11/2005 |
| CN | 101013011 A | 8/2007 |
| JP | H4-138561 | 12/1992 |
| JP | 2011-69546 A1 | 4/2011 |
| WO | 2012049752 A1 | 4/2012 |

OTHER PUBLICATIONS

Chinese Office Action, for the Corresponding CN Application No. 201310178032.6, mailed on Oct. 14, 2014.
Japanese Office Action mailed on Jul. 5, 2016 issued with respect to Japanese Patent Application No. 2013-002624, which is counterpart to the subject application.

* cited by examiner

*Primary Examiner* — Judy Swann
*Assistant Examiner* — John Higgins
(74) *Attorney, Agent, or Firm* — Kratz, Quintos & Hanson, LLP

(57) ABSTRACT

A cooling device which is provided with an evaporator with a built-in wick, a condenser, and a loop type heat pipe which connects the evaporator and condenser in a loop and is provided with a liquid pipe and vapor pipe, wherein the evaporator is divided into a liquid-pipe-side case and a vapor-pipe-side case and wherein a plurality of discharge ports of working fluids and a wick in which the working fluid from the discharge ports is completely permeated are arranged between the two cases. The wick is provided with projecting parts which have recessed parts corresponding to the discharge ports, while the outer circumferential surfaces of the projecting parts are provided with grooves. The working fluid which permeates the wick is changed to a vapor inside the vapor-pipe-side case, collects in the evaporation chamber, and is discharged to the liquid pipe, and thus, dry out of the wick is prevented.

3 Claims, 19 Drawing Sheets

FIG. 18A
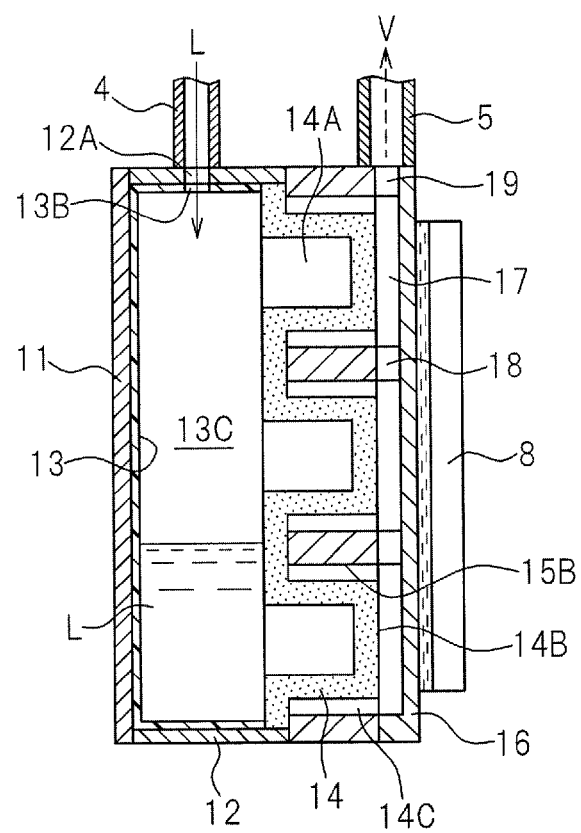
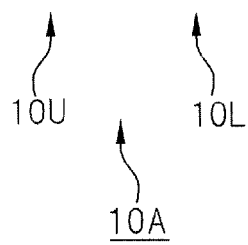
FIG. 18B
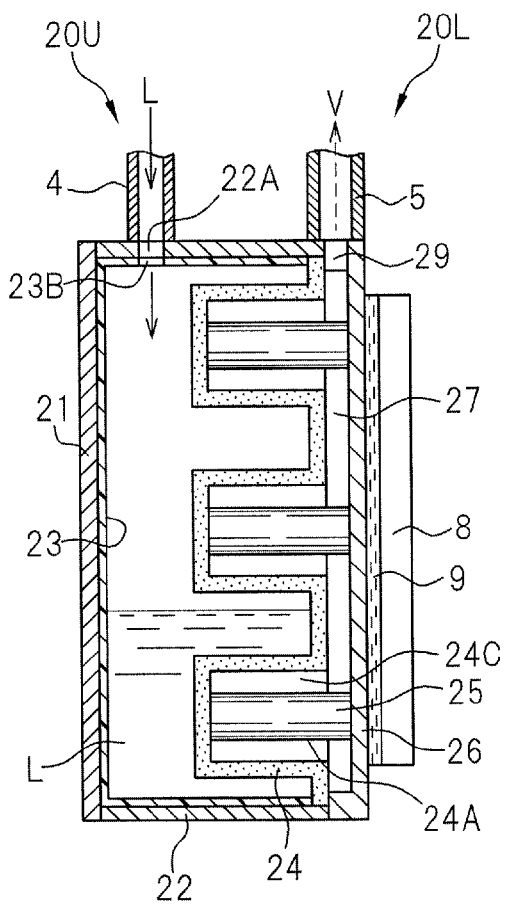
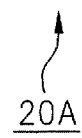

FIG. 19A
FIG. 19B
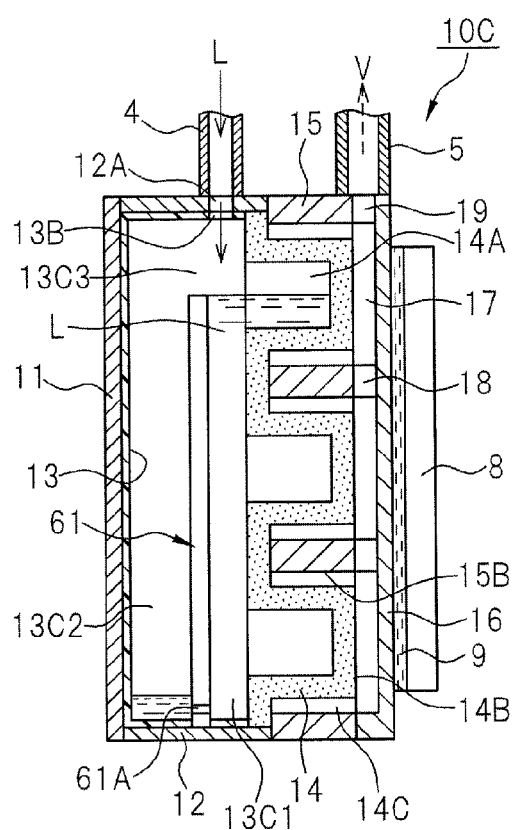
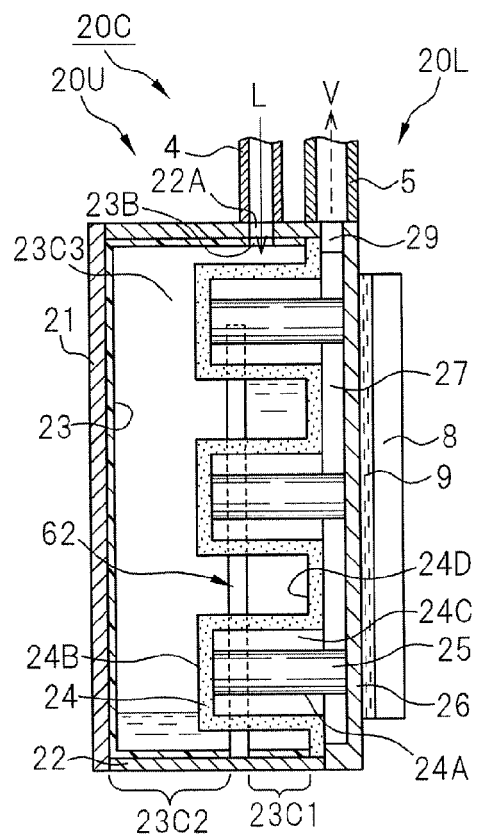
FIG. 19C
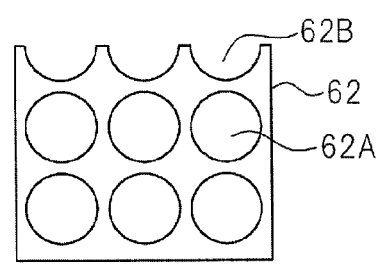

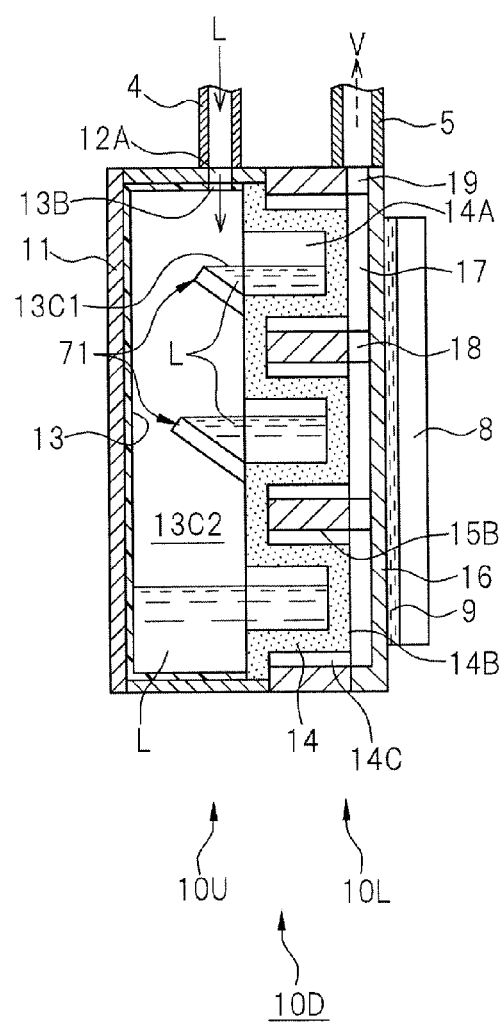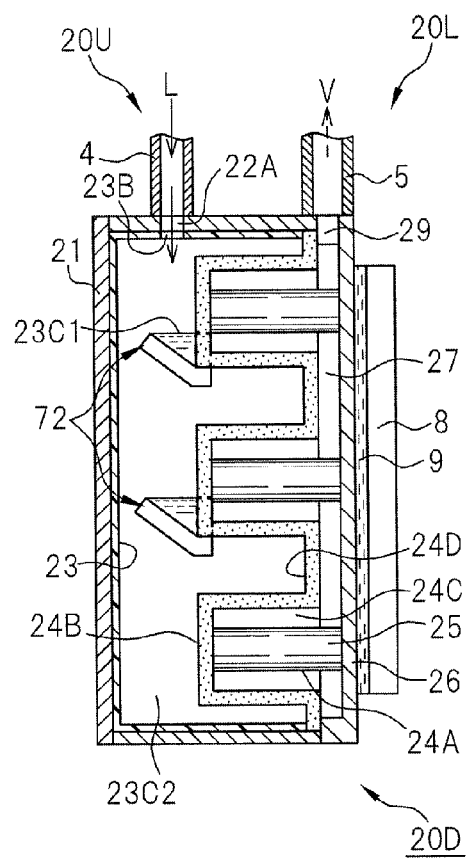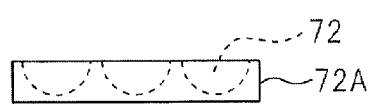

COOLING DEVICE USING LOOP TYPE HEAT PIPE

CROSS-REFERENCE TO RELATED APPLICATIONS

This application claims priority from, and incorporates by reference the entire disclosures of, Japanese Patent Application No. 2012-110917, filed on May 14, 2012, and No. 2013-002624, filed on Jan. 10, 2013.

FIELD

The present application relates to a cooling device using a loop type heat pipe which cools a heat generating member.

BACKGROUND

As a cooling device which cools an electronic device or other heat generating member, a heat pipe which circulates a working fluid which is sealed inside it through a loop shaped pipe and utilizes a phase change of the working fluid to transport heat is known. In general, a heat pipe is a cooling device using two-layer flow of a gas and liquid which circulates a liquid phase cooling solution by using a liquid transport pump and which makes the cooling solution boil by a cooling device or heat receiver and uses the latent heat of evaporation to realize a high cooling performance. A cooling device which uses a liquid transport pump is suitable when the distance between the heat receiving part and the heat dissipating part is long and the heat transport distance is large or when the heat receiving part is made thinner and the flow path is made narrow like with a microchannel or otherwise when the pressure loss of the circulating route is large.

On the other hand, a cooling device using a loop type heat pipe is known which does not use a liquid transport pump, but uses the capillary force of a porous member (wick) provided at an evaporator to circulate a working fluid. A loop type heat pine uses the capillary force of a porous member in an evaporator to circulate a working fluid, so motive power for a heat transport pump etc. is not required and the vapor pressure inside the evaporator can be used to transport heat to a condenser at a distant location. Such a loop type heat pipe is, for example, disclosed in Japanese Laid-Open Patent Publication No. 2009-115396A and Japanese Laid-Open Patent Publication No. 2007-247931A.

The loop type heat pipe which is disclosed in Japanese Laid-Open Patent Publication No. 2009-115396A is characterized by an evaporator structure which has a plurality of wicks inserted in the horizontal direction and which is thinner and can be increased in evaporation area (surface area of wicks) compared with the case of a single wick. Further, the loop type heat pipe which is disclosed in Japanese Laid-Open Patent Publication No. 2007-247931A is characterized by a structure which has a wick superposed on a heating surface and which is enlarged in evaporation area and improved in performance by provision of relief shapes facing the heating surface and wick.

However, in the loop type heat pipe which is disclosed in Japanese Laid-Open Patent Publication No. 2009-115396A, the evaporator is made thinner, so it is difficult to make the liquid phase working fluid uniformly permeate the wide area porous member and evaporate, part of the porous member dries out resulting in circulation of the working fluid becoming unstable, and the performance fails. Further, in the loop type heat pipe which is disclosed in Japanese Laid-Open Patent Publication No. 2007-247931A, realizing greater thinness is easy, but when the heat generating member increases in the amount of heat generated and the amount of evaporation increases, it becomes harder to supply liquid to the tip of the wick, dry out occurs, the evaporation area is reduced, and the cooling performance remarkably falls.

SUMMARY

In one aspect, the present application has as its object the provision of a cooling device using a loop type heat pipe which has a flat plate type evaporator wherein the evaporator can be made thinner without accompanying dry out of the porous member (wick) or drop in the cooling performance.

In another aspect, the present application has as its object the provision of a cooling device using a loop type heat pipe which has a flat plate type evaporator wherein the evaporator can function both when the cooling device is laid on its side horizontally or is arranged standing up vertically.

According to one embodiment, there is provided a cooling device which cools a heat generating member by a loop type heat pipe which is provided with an evaporator with a built-in porous member, a condenser, and a liquid pipe and vapor pipe which connect the evaporator and the condenser in a loop shape, the cooling device characterized in that the evaporator is provided with a first case and a second case, the first case is formed by a material with a low thermal conductivity and runs a working fluid which is supplied from the liquid pine through a porous member to send it to the second case side, the second case is formed by a material with a high thermal conductivity and is provided with heat receiving part which receives heat from the heat generating member, a heating part which uses the received heat to vaporize the working fluid which seeps out from the porous member, and a vapor collecting part which collects vapor of the working fluid and sends it to the vapor pipe, and the porous member is provided with relief shapes which increase the permeation area of the working fluid. which is sent from the first case to the second case.

BRIEF DESCRIPTION OF DRAWINGS

FIG. 18A is a cross-sectional view which illustrates a state of use of the evaporator of the third embodiment which is illustrated in FIG. 14A in the state of use which is illustrated in FIG. 17.

FIG. 18B is a cross-sectional view which illustrates a state of use of the evaporator of the fourth embodiment which is illustrated in FIG. 16A in the state of use which is illustrated in FIG. 17.

FIG. 19A is a cross-sectional view which illustrates a fifth embodiment of an evaporator of a cooling device which uses a loop type heat pipe of the present application.

FIG. 19B is a cross-sectional view which illustrates a sixth embodiment of an evaporator of a cooling device which use a loop type heat pipe of the present application.

FIG. 19C is a front view of a separator which is illustrated in FIG. 19B.

FIG. 20A is a cross-sectional view which illustrates a seventh embodiment of an evaporator of a cooling device which uses a loop type heat pipe of the present application.

FIG. 20B is a cross-sectional view which illustrates an eighth embodiment of an evaporator of a cooling device which uses a loop type heat pipe of the present application.

FIG. 20C is a front. view of a separator which is illustrated in FIG. 20B.

DESCRIPTION OF EMBODIMENTS

Below, the attached drawings will be used to explain embodiments of the present application based on specific examples.

Figure 1:
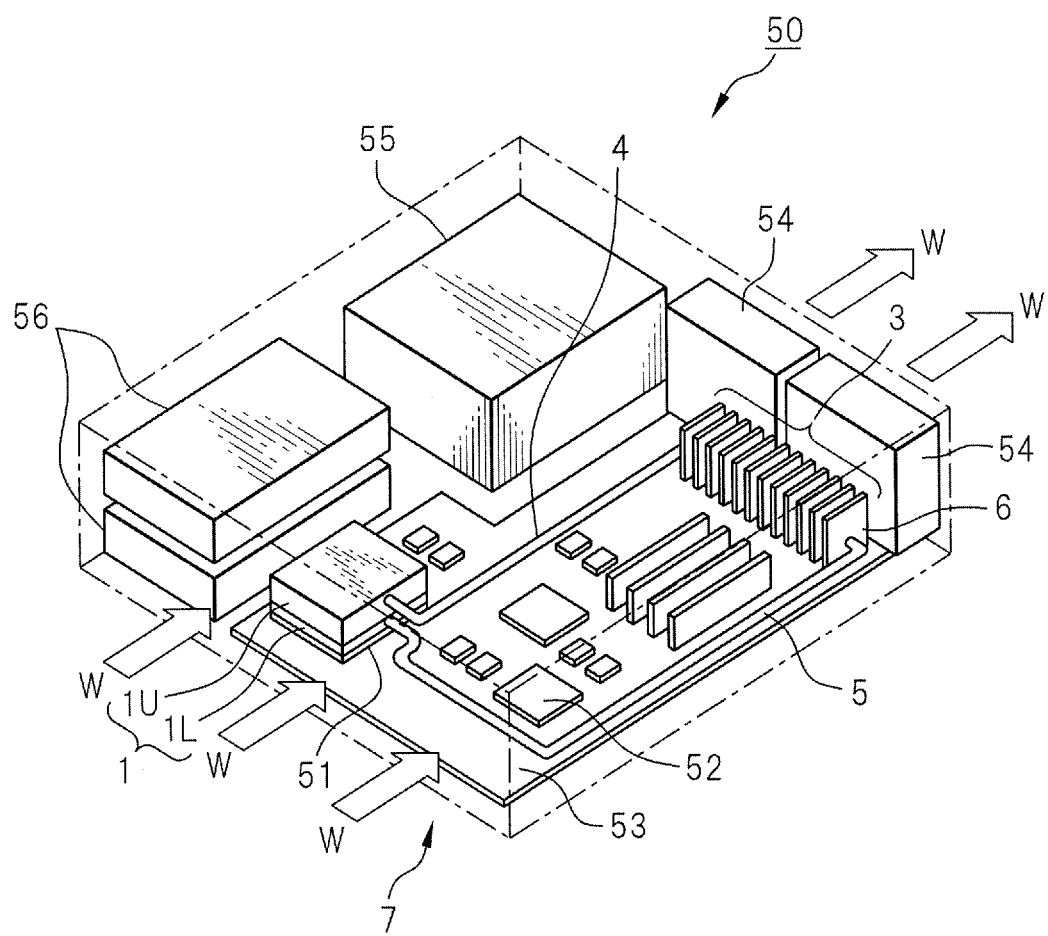
FIG. 1 is a perspective view in the case where a computer in which a cooling device using a loop type heat pipe of one embodiment of the present application is assembled is laid on its side horizontally.

FIG. 1 is a perspective view of electronic equipment, specifically a computer 50, in which a cooling device 7 using a loop type heat pipe of one embodiment of the present application is assembled. Note that after this, the cooling device 7 will also be referred to as the synonymous "loop type heat pipe 7". The computer 50 includes a circuit board 53 which mounts a plurality of circuit components 52 which include a CPU (central processing unit) 51, a blowing fan 54 which air cools components on the circuit hoard 53, power supply 55, and auxiliary storage device constituted by an HDD (hard disk drive) 56. The components on the circuit board 53 is cooled by the blowing fan 54, but the high temperature CPU 51 is difficult to be sufficiently cooled by lust the cooling air W, so is cooled by the loop type heat pipe 7.

The loop type heat pipe 7 is provided with an evaporator 1 and a condenser 3. The condenser 3 includes a plurality of heat radiating fins 6. In the present application, the evaporator 1 has a flat plate shape and is provided with an upper case 1U and a lower case 1L. The upper case 1U and the condenser 3 are connected by a liquid pipe 4 through which a liquid flows. The lower case 1L and the condenser 3 are connected by a vapor pipe 5 through which a vapor flows. Further, at the boundary part of the upper case 1U and the lower case 1L, a wick is provided with circulates the working fluid of the loop type heat pipe 7 (hereinafter referred to as the "working fluid"). The evaporator 1 is brought into close contact with the heat generating component (CPU) 51 on the circuit board 53 through thermal grease and robs heat from the heat generating component 51 to cool it.

The wick is a porous member which is made of a ceramic, metal, plastic, or other material. The inside of the loop type heat pipe 7 is completely evacuated, then a water-based, alcohol-based, fluorinated hydrocarbon compound-based, or other liquid is sealed in it as a working fluid. In the present application, acetone is used as the working fluid of the loop type heat pipe 7, the inside of the loop type heat pipe 7 is evacuated, then a suitable amount of acetone in the saturated state is sealed inside. The working fluid is heated at the wick of the evaporator 1 to change from a liquid phase working fluid to a vapor which flows through the vapor pipe 5. It is cooled by the heat radiating fins 6 of the condenser 3 whereby the vapor becomes a liquid phase working fluid which is refluxed from the liquid pipe 4 to the evaporator 1. The working fluid circulates through the inside of the loop type heat pipe 7 due to the capillary force (capillary tube force) of the wick.

At the time of operation of the computer 50, an amount of heat of 150 W is generated from the heat generating component 51. This amount of heat is absorbed by the flat plate type evaporator 1 of the loop type heat pipe 7. The liquid phase acetone which seeps out from the wick inside of the evaporator 1 evaporates and vaporizes. The vaporized acetone vapor moves through the condenser 3 whereby the heat which was absorbed at the evaporator 1 is transported to the condenser 3. The acetone vapor which moves through the condenser 3 is cooled and condensed at the condenser 3 to be liquefied. The amount of heat which is discharged by the condenser 3 is dissipated from the heat radiating fins 6 and is discharged to the outside of the housing of the computer 50 by the air which is blown from the fan 54.

Figure 2:
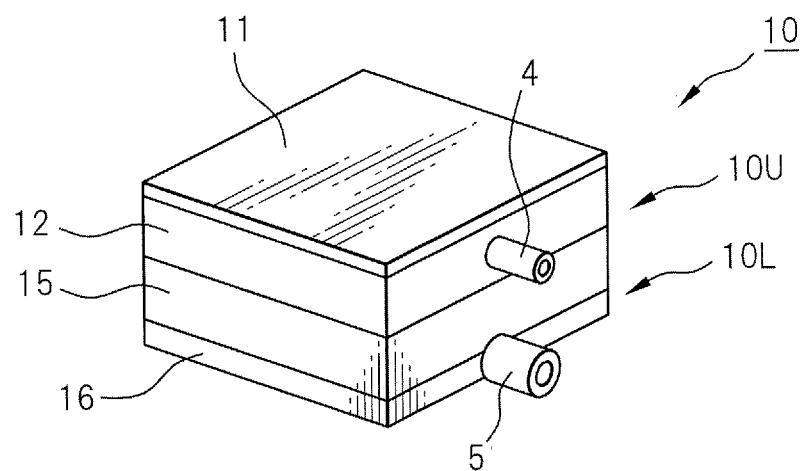
FIG. 2 is a perspective view which illustrates a first embodiment of an evaporator which is illustrated in FIG. 1.

FIG. 2 is a perspective view which illustrates an evaporator 10 of a first embodiment of the evaporator 1 which is illustrated in FIG. 1. The outer size of the evaporator 10 of the first embodiment includes, for example, vertical and horizontal dimensions of 50 mm×50 mm and a height of 30 mm. The evaporator 10 of the first embodiment is provided with an upper case 10U to which a liquid pipe 4 is connected and a lower case 10L to which a vapor pipe 5 is connected. The upper case 10U includes a cover 11 and a frame 12, while the lower case 10L includes a wick case 15 which has a built-in wick and a bottom plate 16.

Figure 3:
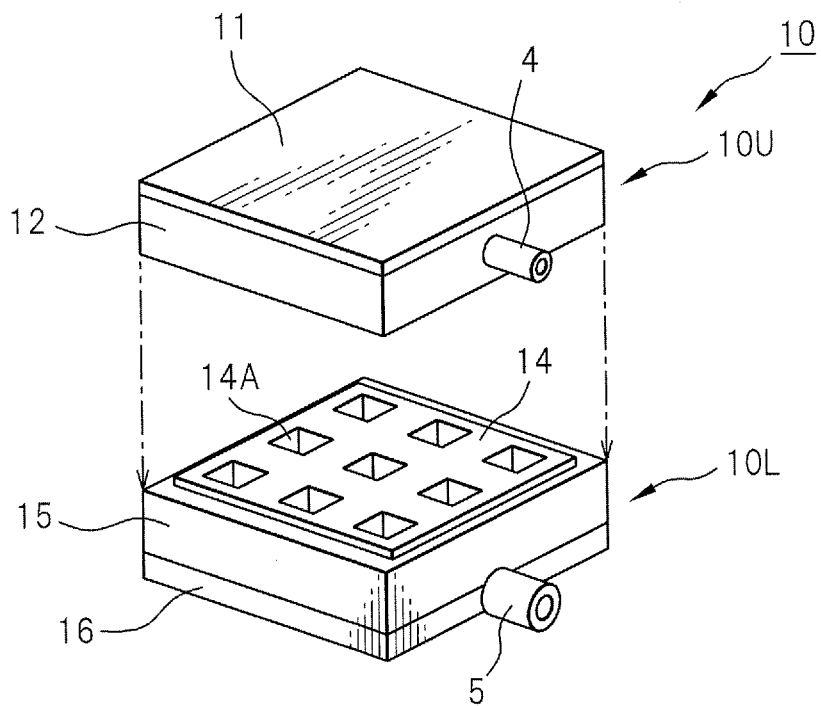
FIG. 3 is a disassembled perspective view which disassembles the evaporator which is illustrated in FIG. 2 into an upper case and lower case.

FIG. 3 is a disassembled perspective view which disassembles the evaporator 10 which is illustrated in FIG. 2 into an upper case 10U and lower case 10L. As will be understood from this figure, the wick 14 is provided at the boundary part of the upper case 10U and the lower case 10L. At the surface of the wick 14 at the upper case 10U side, in the first embodiment, there are nine lattice-shaped recessed parts 14A. The recessed parts 14A function as evaporation chambers of working fluid. In the first embodiment, the number of recessed parts 14A is three in the vertical direction and three in the horizontal direction for a total of nine, but the number of recessed parts 14A is not particularly limited.

Figure 4:
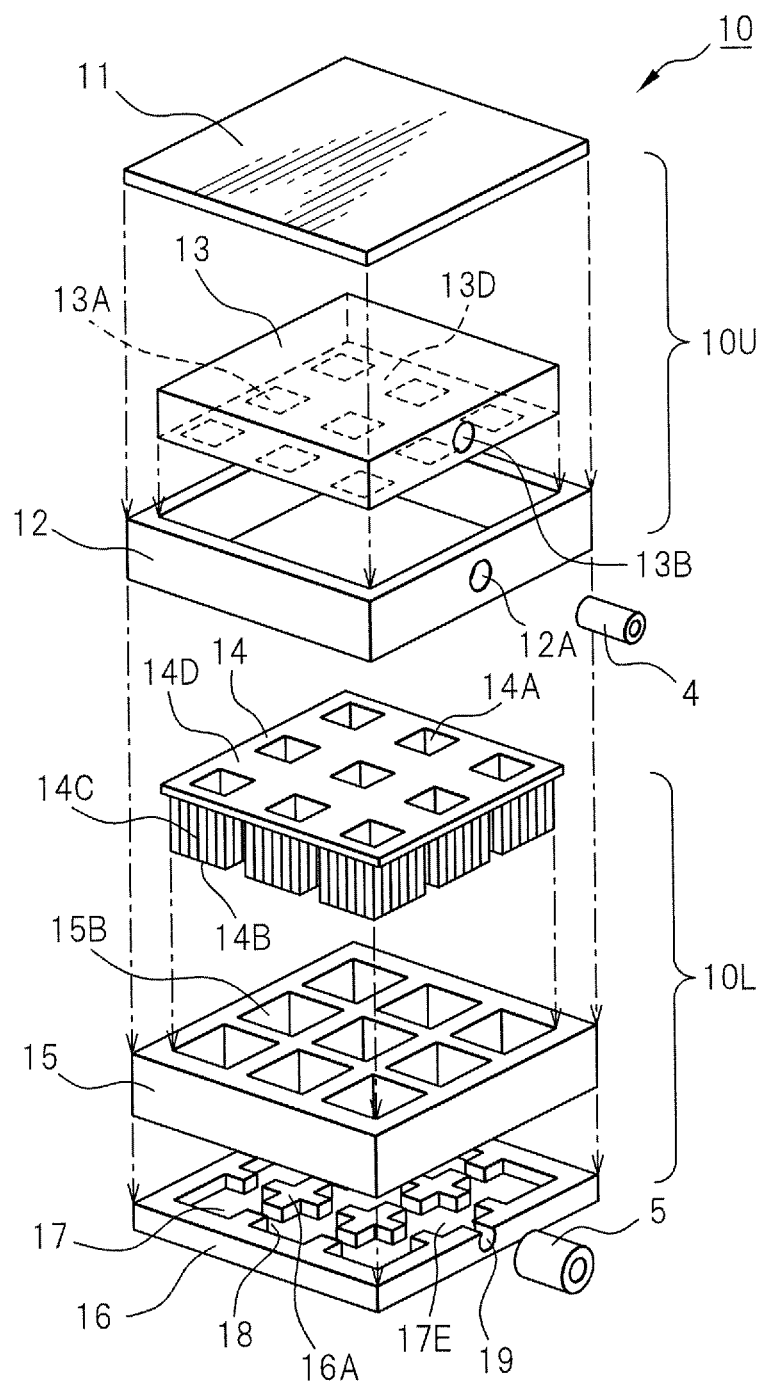
FIG. 4 is a disassembled perspective view which further disassembles the upper case and lower case of the evaporator which is illustrated in FIG. 3.
Figure 6A:
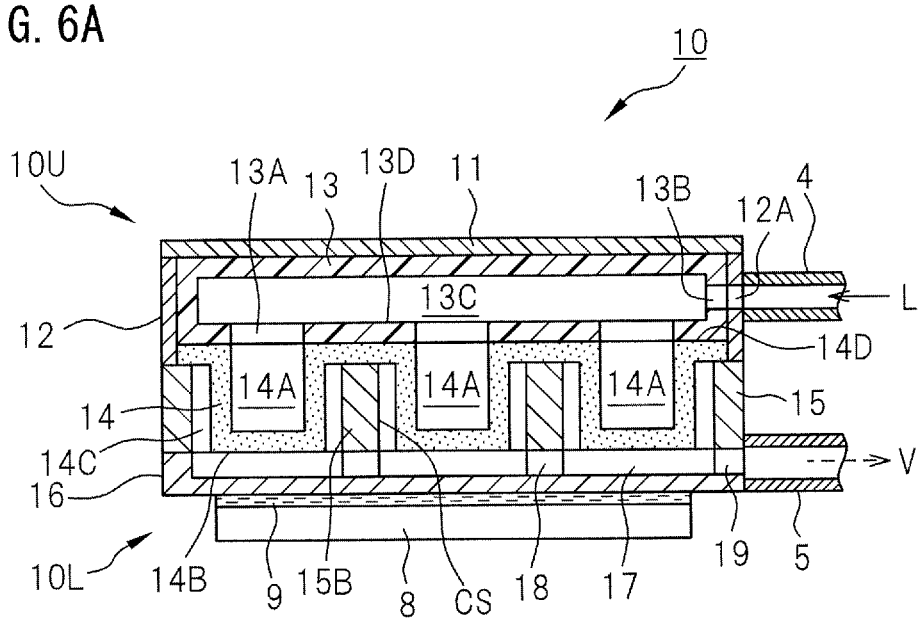
FIG. 6A is a cross-sectional view which illustrate the state where the evaporator which is illustrated in FIG. 4 is placed on a heat generating member.

FIG. 4 is a disassembled perspective view which further disassembles the upper case 10U and lower case 10L of the evaporator 10 which is illustrated in FIG. 3. Further, FIG. 6A is a cross-sectional view which illustrates a longitudinal cross-section of the evaporator 10 of the first embodiment which is explained in FIG. 2 and illustrates the cross-section at the time of assembly of the parts which are illustrated in FIG. 4. Therefore, here, FIG. 4 explains the structure of the evaporator 10 of the first embodiment together with FIG. 6A.

The upper case 10U is provided with a storage case 13 as a chamber of the working fluid between the cover 11 and the frame 12. Inside the storage case 13, there is a storage part 13C of the working fluid. The height at the inside of the storage case 13 is about 10 mm. The storage case 13 directly contacts the working fluid, so is made of nylon plastic. Further, the material of the cover 11 and the frame 12 is stainless steel with a relatively low thermal conductivity. As a result, leakage of heat to the working fluid from the storage case 13 is blocked. Furthermore, by making the material of the cover 11 and frame 12 stainless steel, the heat from the lower case 10L which contacts the heat generating member is hardly ever transferred to the working fluid.

At the bottom surface 130 of the storage case 13 at positions corresponding to the nine recessed parts 14A at the flat part 14D of the wick 14, discharge ports 13A of the working fluid are provided. In the state with the upper case 10U superposed over the lower case 10L, as illustrated in FIG. 6A, the discharge ports 13A of the storage case 13 are superposed over the openings of the recessed parts 14A of the wick 14. Therefore, the working fluid inside of the storage case 13 completely flows into the recessed parts 14A of the wick 14 and moves to the lower case 10L through the wick 14. Further, in the state where the storage case 13 is held between the cover 11 and the frame 12, the inflow port 13B of the working fluid communicates with the inflow port 12A of the working fluid which is provided at the frame 12 and the working fluid L from the liquid pipe 4 which is attached to the inflow port 12A flows into the storage part 13C as illustrated by the solid line.

On the other hand, the lower case 10L is provided with a wick case 15 which holds a wick 14 and a bottom plate 16. At the surface of the wick 14 at the wick case 15 side, projecting parts 14B are provided which correspond to the recessed parts 14A. The outer dimensions of the projecting parts 14B may be made 14 mm×14 mm or so and the height 15 mm or so. Further, at the side surfaces of the projecting parts 14B, for example, grooves of a width 1 mm, depth of 0.5 mm to 1 mm, and pitch of 2 mm, that is, the grooves 14C, are provided uniformly. The distances of the outer circumferential surfaces of the projecting parts 146 from the inner circumferential surfaces of the recessed parts 14A are all the same. The depths of the grooves 140 are the same at all parts. Therefore, the thicknesses from the bottom surfaces of the grooves 14C to the recessed parts 14A are uniform.

Figure 5A:
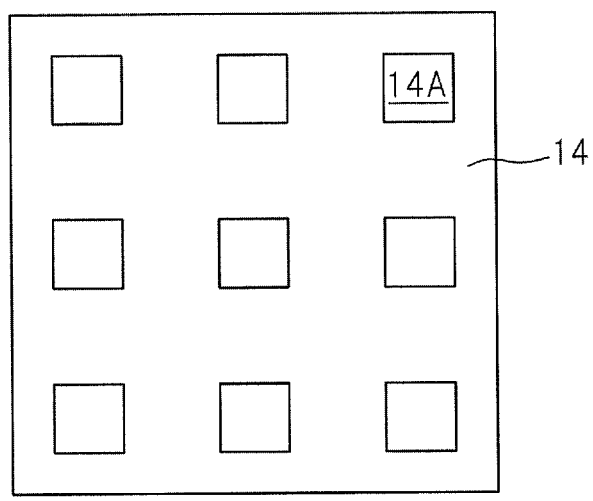
FIG. 5A is a plan view of a wick which is illustrated in FIG. 2.
Figure 5B:
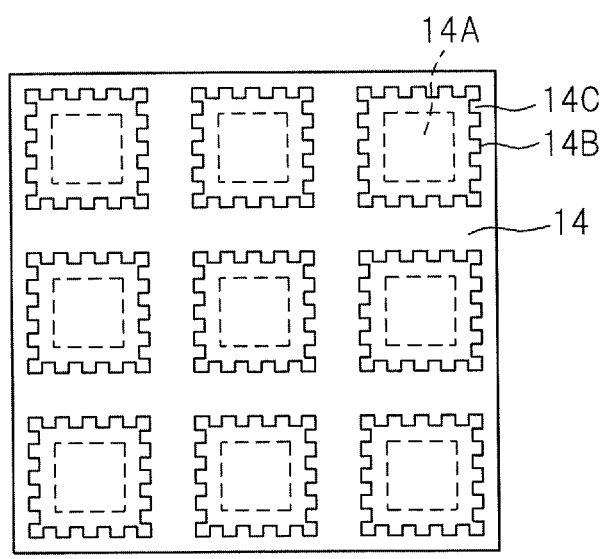
FIG. 5B is a bottom view of a wick which is illustrated in FIG. 5A.

FIG. 5A is a plan view of the wick 14, while FIG. 5B is a bottom view of the wick 14. The grooves 14C at the side surfaces of the projecting parts 14B of the wick 14 which is illustrated in FIG. 5B are drawn by dimensions which are different from the above-mentioned dimensions so as to exaggeratedly illustrate the shape of the wick 14. The wick 14 is a made of a porous PTFE (polytetrafluoroethylene) resin sintered body with a porosity of 40% and an average value of pore diameters of 20 μm.

At the lower case 10L, the wick case 15 which is provided at the bottom side of the wick 14 is provided with a number of wick holding parts 15B corresponding to the number of the projecting parts 14B which hold the projecting parts 14B of the wick 14. The depths of the wick holding parts 15B are the same as the heights of the projecting parts 14B of the wick 14. In the present embodiment, the wick case 15 is made of copper with a good thermal conductivity.

The inner dimensions of the wick holding parts 15B are equal to or slightly smaller than the outer dimensions of the projecting parts 14B of the wick 14. The projecting parts 14B of the wick 14 are structured to be fit into the wick holding parts 15B of the wick case 15 in a slightly compressed state. That is, to obtain sufficient adhesion with the copper wick case 15, the dimensions of the projecting parts 14B of the wick 14 should be made equal to the dimensions of the wick holding parts 15B or larger by about 50 to 200 μm. Further, in the first embodiment, to obtain sufficient adhesion between the projecting parts 14B of the wick 14 and the wick holding parts 15B of the wick case 15, the side surfaces where the two contact are vertical to the bottom plate 16.

At the bottom side of the wick case 15, a bottom plate 16 made of the same copper which has a good thermal conductivity is provided. At the top surface of the bottom plate 16, a clearance of 3 mm is provided from the bottom surface of the wick case 15 to provide a recessed part. This recessed part is divided by partition walls 16A to form nine evaporation chambers 17. The openings of the evaporation chambers 17 are superposed with the wick holding parts 15B. Further, the evaporation chambers 17 are communicated with adjoining evaporation chambers 17 by connecting holes 18. Further, at the wick case 15 at the outside of the evaporation chamber 17E which is positioned at the end of the evaporator 10, an outflow port 19 is provided. The vapor pipe 5 is connected to this outflow port 19. An evaporator 10 which is provided with the above such structure is attached on the heat generating member 8 with thermal grease 9 interposed between them.

Here, the operation of the evaporator 10 of the first embodiment will be explained using FIG. 6B. In the evaporator 10 of the first embodiment, the working fluid L which flows in from the liquid pipe 4 to the storage part 13C of the storage case 13 flows along the bottom surface 13D of the storage case 13 and is distributed to the insides of the recessed parts 14A of the wick 14. If the heat generating member 8 generates heat, the heat is transferred, as illustrated by the broken line H, to the wick case 15 whereby the lower case in rises in temperature. The working fluid L inside of the recessed parts 14A of the wick 14, as illustrated by the arrows CP at the parts which face the wick case 15, permeates the wick 14 by the capillary phenomenon and seeps out to the grooves 14C. The working fluid L which seeps out to the grooves 14C becomes the vapor V due to the heat of the wick mounting columns 25 which rise in temperature and are connected at the evaporation chambers 17. The vapor V of the working fluid which collects at the evaporation chambers 17 flows through the connecting holes 18, collects at the evaporation chamber 17E which is positioned at the end of the evaporator 10 which is illustrated in FIG. 4, and passes through the outflow port 19 to be discharged from the vapor pipe 5.

In the structure of the evaporator 10 of the first embodiment, as explained above, the distances from the inner circumferential surfaces of the recessed parts 14A to the outer circumferential surfaces of the projecting parts 14B are all the same. Similarly, the distances from the inner circumferential surfaces of the recessed parts 14A to the bottom surfaces of the grooves 14C are all the same. Therefore, when the working fluid L permeates through the wick 14 and collects in the evaporation chambers 17, since the distances of permeation from the inner circumferential surfaces of the recessed parts 14A of the wick 14 to the metal surface (wick case 15) are the same, partial drying hardly ever occurs at the wick 14. Further, even if heat causes bubbles to occur in the working fluid L inside the recessed parts 14A of the wick 14, the bubbles pass through the storage part 13C of the storage case 13, so the bubbles do not collect inside the recessed parts 14A and partial drying hardly ever occurs at the wick 14.

Figure 6B:
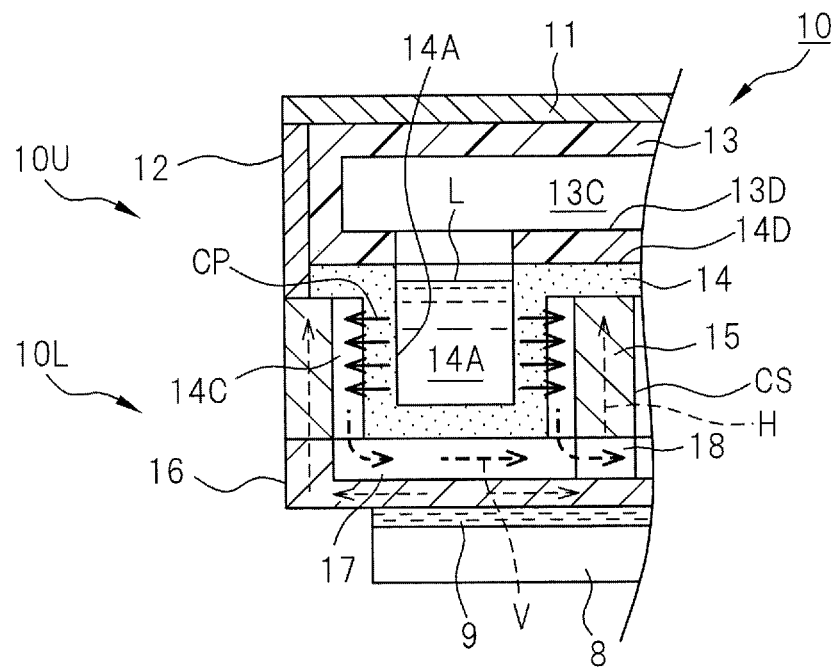
FIG. 6B is an explanatory view which explains movement of the working fluid in FIG. 6A.
Figure 7A:
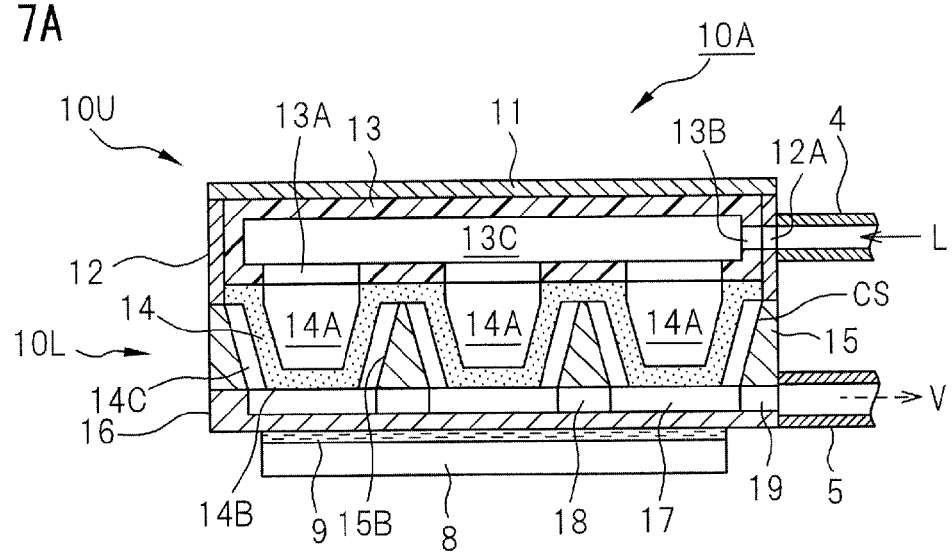
FIG. 7A is a cross-sectional view which illustrates the same portion as FIG. 6A which illustrates the structure of a modification of the first embodiment of an evaporator of sloop type heat pipe of the present application.

Further, in the evaporator 10 of the first embodiment, as illustrated in FIGS. 6A and 6B, the contact surfaces CS between the projecting parts 14B of the wick 14 and the wick holding parts 15B of the wick case 15 are vertical to the bottom plate 16. As in the modified embodiment which is illustrated in FIG. 7A, the contact surfaces CS may also be slanted. If, in this way, making the contact surfaces CS slanted and making the cross-sectional shapes of the projecting parts 14B frusto-conical, the projecting parts 14B may easily fit into the wick holding parts 15B and the assembly of the evaporator 10 becomes easy. The rest of the structure and operation of the evaporator 10A of the modification of the evaporator 10 of the first embodiment which is illustrated in FIG. 7A is the same as the evaporator 10 which is illustrated in FIG. 6A, so the same members are assigned the same reference notations and their explanations are omitted.

Figure 7B:
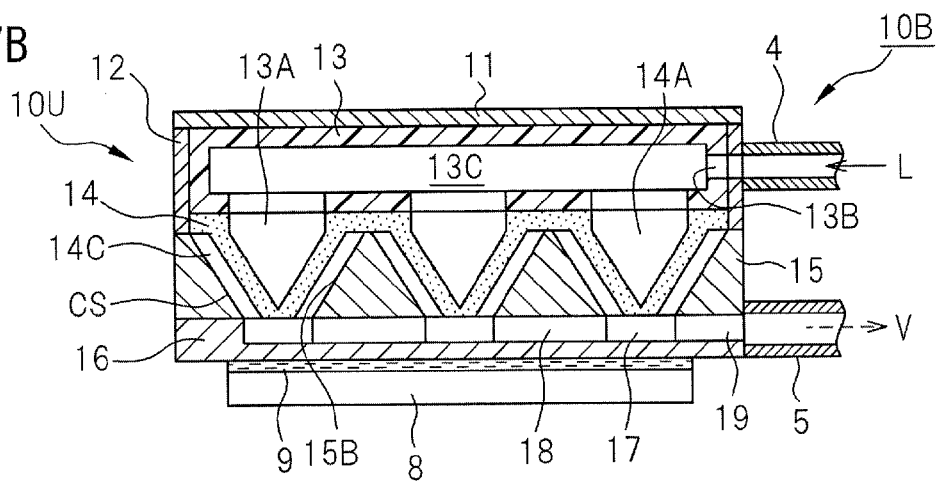
FIG. 7B is a cross-sectional view which illustrates the same portion as FIG. 6A which illustrates the structure of another modification of the first embodiment of an evaporator of a loop type heat pipe of the present application.
Figure 7C:
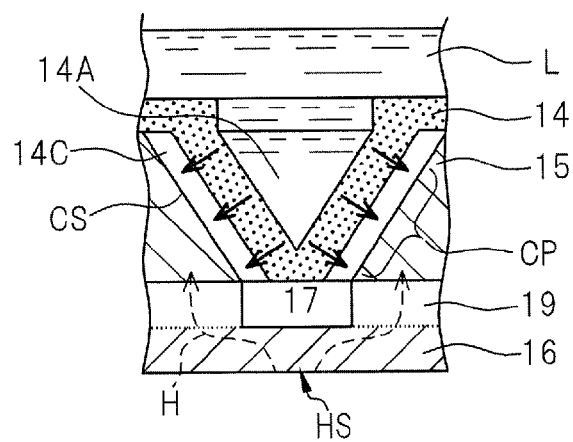
FIG. 7C is a partially enlarged cross-sectional view which explains the state of permeation of a working fluid in a wick in another embodiment which is illustrated in FIG. 7B.

Further, as illustrated in FIG. 7B, an evaporator 10B of another modified embodiment further increased in slant is possible. In the evaporator 10B which is illustrated in FIG. 7B, the recessed parts 14A of the wick 14 are not frusto-conical in shape but are made conical in shape with the bottom surfaces of the recessed parts 14A eliminated, so the entire inner circumferential surfaces of the recessed parts 14A of the wick 14 face the wick case 15. For this reason, if the heat H which is transferred from the heating surface of the bottom plate 16 is transferred to the wick case 15 and the contact surfaces CS are heated, permeation from the entire inner circumferential surfaces of the recessed parts 14A occurs due to the capillary phenomenon as illustrated by the arrows CP. At this time, the depths of the grooves 14C are uniform, so the distances of permeation of the working fluid L also become uniform. The structure of the other parts of the evaporator 10B is the same as that of the evaporator 10A which is illustrated in FIG. 7A, so the same members are assigned the same reference notations and their explanations are omitted.

Figure 8:
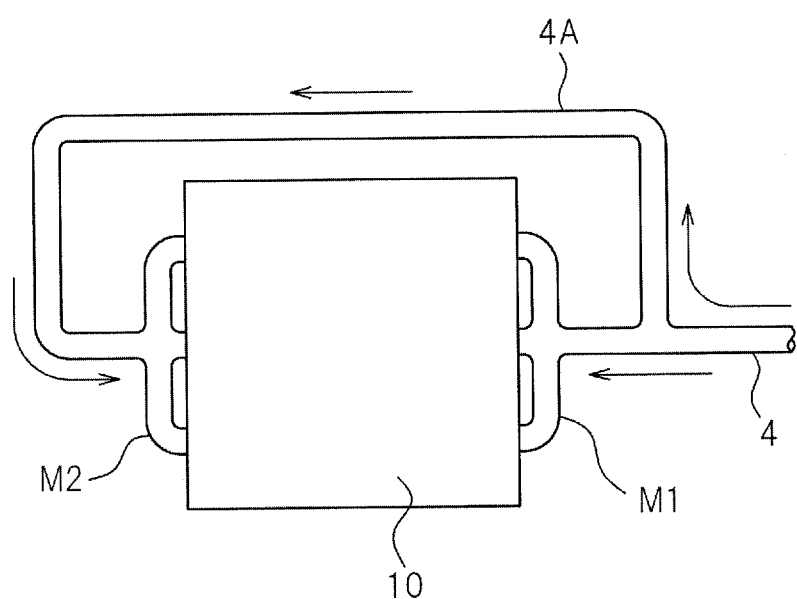
FIG. 8 is a plan view which illustrates a modification of a liquid pipe which is connected to an upper case in the first embodiment of an evaporator of a loop type heat pipe of the present application.

On the other hand, in the evaporators 10, 10A, 10B of the first embodiment, the case may be considered where the working fluid L which is supplied from the liquid pipe 4 does not evenly collect inside all of the recessed parts 14A of the wick 14. In such a case, as illustrated by the modification which is illustrated in FIG. 8, manifolds M1 and M2 may be attached to the facing surfaces of the evaporator 10, the manifold M1 may be connected to the liquid pipe 4, and the manifold M2 may be connected to the branch pipe 4A which is branched from the liquid pipe 4.

An experiment was conducted in which a loop type heat pipe which uses the evaporator 10 of the first embodiment was attached inside the electronic equipment and the electronic device (CPU) inside the operating electronic equipment was cooed. As a result, it was learned that even in the state where the electronic device operates at a maximum speed and the amount of heat generated is about a maximum 150 W, the junction temperature is held at 60° C. or less and good cooling is possible. Further, it was learned that under all conditions, including the state where the electronic equipment is operating at full capacity, the wick 14 in the evaporator 10 wilt not dry out, the electronic device will not become an abnormally high temperature, and stable cooling performance is obtained. In this way, if using the thin, type, plate-shaped evaporator 10 of the first embodiment for the loop type heat pipe, a high heat generating member will be efficiently cooled and the electronic equipment or computer becomes higher in performance.

Figure 9:
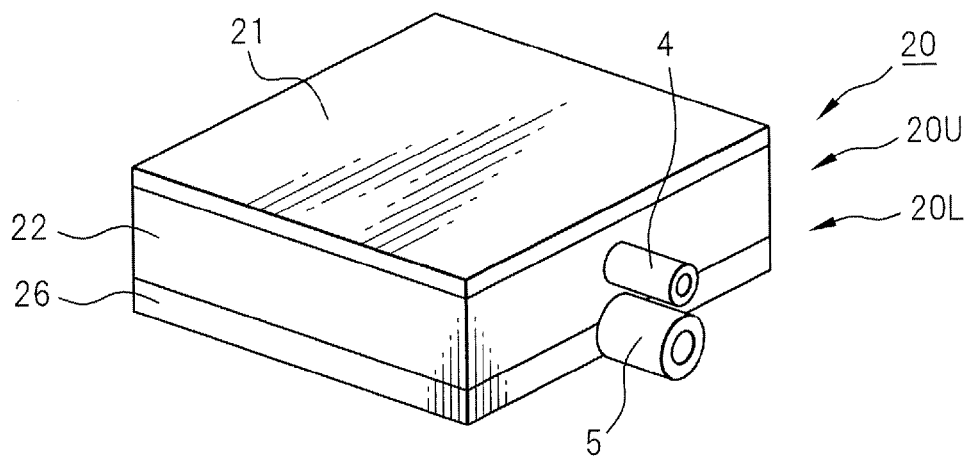
FIG. 9 is a perspective view which illustrates a second embodiment of an evaporator of a loop type heat pipe of the present application.

FIG. 9 is a perspective view which illustrates an evaporator 20 of a second embodiment of the evaporator 1 which is illustrated in FIG. 1. The outer size of the evaporator 20 of the second embodiment includes, for example, vertical and horizontal dimensions of 50 mm×50 mm and a height of 30 mm. The evaporator 20 of the second embodiment is provided with an upper case 20U to which a liquid pipe 4 is connected and a lower case 20L to which a vapor pipe 5 is connected. The upper case 20U includes a cover 21 and a frame 22, while the lower case 20L includes a bottom plate 26 which has a built-in wick.

Figure 10:
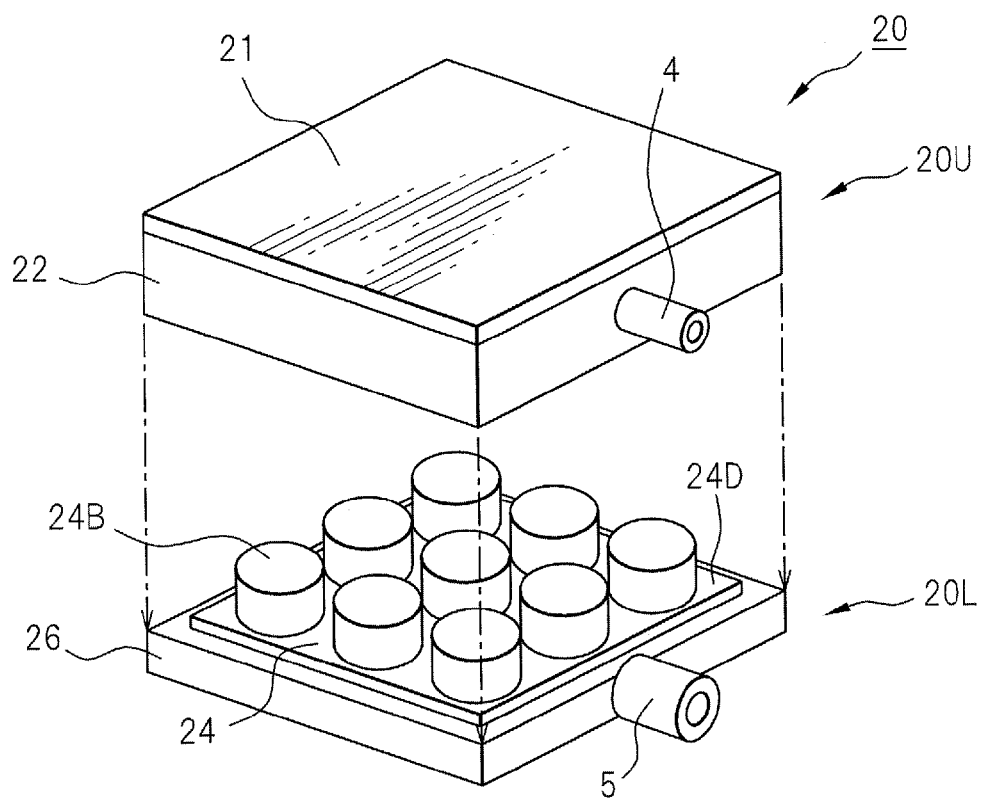
FIG. 10 is a disassembled perspective view which illustrates the state of disassembly of the evaporator which is illustrated in FIG. 9 into the upper case and lower case.

FIG. 10 is a disassembled perspective view which disassembles the evaporator 20 which is illustrated in FIG. 9 into an upper case 20U and a lower case 20L. As will be understood from FIG. 10, the wick 14 is provided at the boundary part of the upper case 20U and the lower case 20L. At the flat part 24D at the upper case 20U side of the wick 24, in the second embodiment, there are nine columnar shaped projecting parts 24B. The wick 24 has the function of making the working fluid evaporate to obtain a vapor. In the second embodiment, the number of the projecting parts 24B at the wick 24 is three in the vertical direction and three in the horizontal direction for a total of nine, but the number of the projecting parts 24B is not particularly limited.

Figure 11:
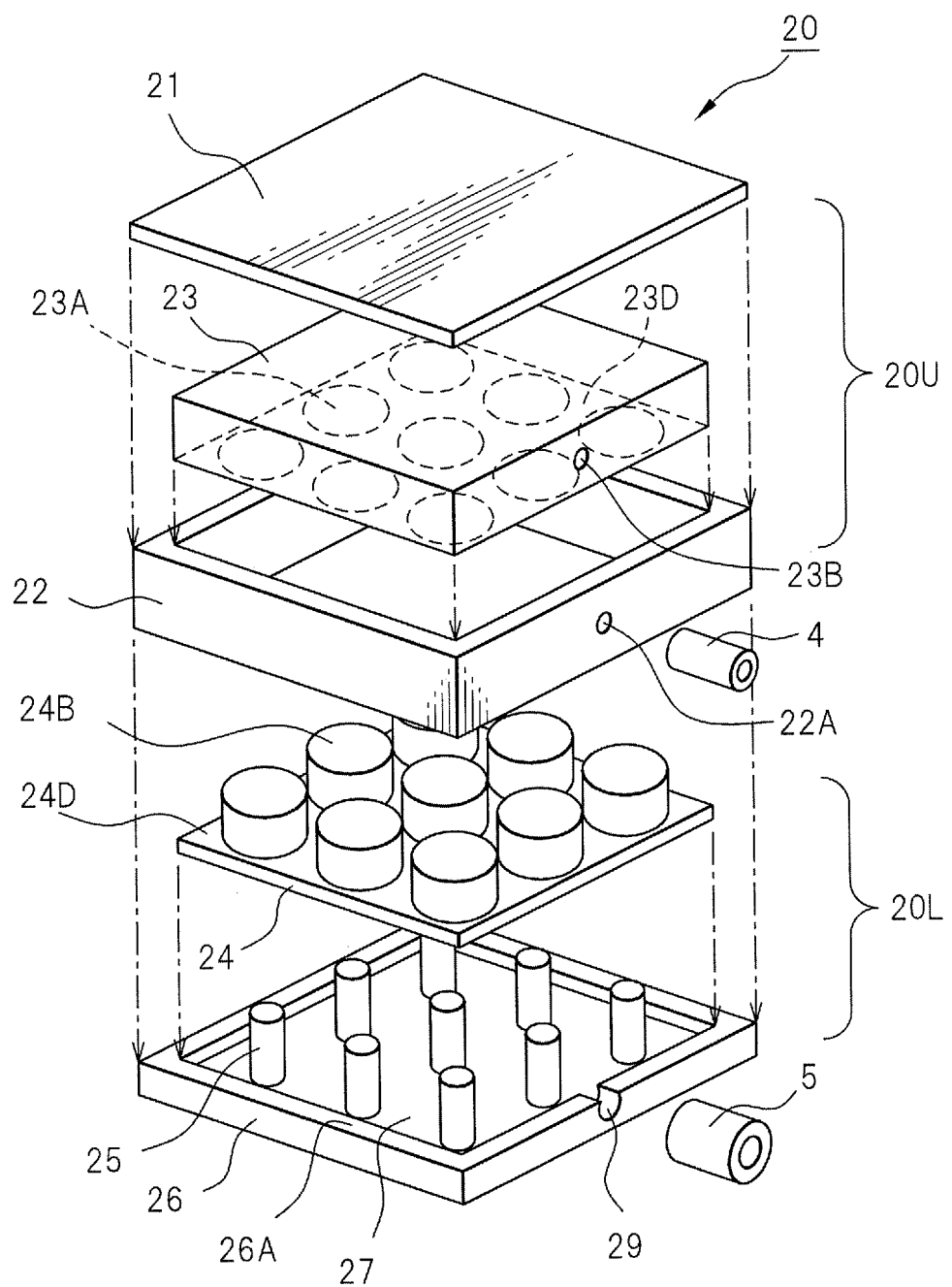
FIG. 11 is a disassembled perspective view which illustrates the state of further disassembly of the upper case and lower case of the evaporator which is illustrated in FIG. 10.
Figure 12A:
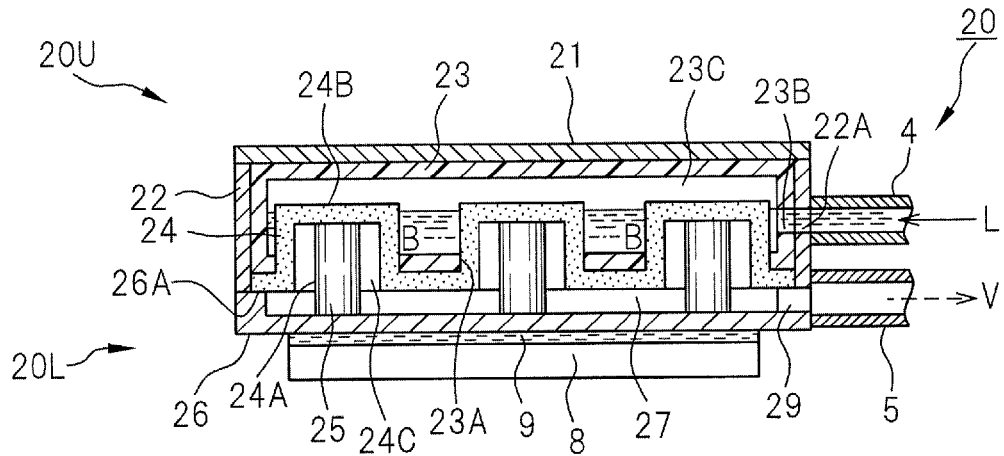
FIG. 12A is a cross-sectional view which illustrates a state where the evaporator which is illustrated in FIG. 11 is placed on a heat generating member.

FIG. 11 is a disassembled perspective view which further disassembles the upper case 20U and the lower case 20L of the evaporator 20 which is illustrated in FIG. 10. Further, FIG. 12A is a cross-sectional new which illustrates a longitudinal cross-section of the evaporator 20 of the second embodiment which is explained in FIG. 9 and illustrates a cross-section at the time of assembly of the members which are illustrated in FIG. 11. Therefore, here, FIG. 11, together with FIG. 12A, explains the structure of the evaporator 20 of the second embodiment.

The upper case 20U is provided with a storage case 23 as a chamber of the working fluid between the cover 21 and the frame 22. Inside the storage case 23, there is a storage part 23C of the working fluid. The height at the inside of the storage case 23 is about 10 mm. The storage case 23 directly contacts the working fluid, so is made of nylon plastic. Further, the material of the cover 21 and the frame 22 is stainless steel with a relatively low thermal conductivity. As a result, it is hard for heat to be transferred from the outside through the storage case 23 to the working fluid at the inside. Furthermore, by making the material of the cover 21 and frame 22 stainless steel, the heat from the lower case 20L which contacts the heat generating member hardly ever is transferred to the storage case 23.

At the bottom surface 23D of the storage case 23 at positions corresponding to the nine pro coning parts 24B at the wick 24, discharge ports 23A of the working fluid are provided. In the state with the upper case 20U superposed over the lower case 20L, as illustrated in FIG. 12A, the protecting parts 24B of the wick 24 are inserted through the discharge ports 23A of the storage case 23 and stick out into the storage part 23C of the storage case 23. There is no clearance between the outer circumferential surfaces of the projecting parts 24B and the inner circumferential surfaces of the discharge ports 23A, so the working fluid inside of the storage case 23 permeates to all of the projecting parts 24B of the wick 24 and passes through the wick 24 to move to the lower case 20L. Further, in the state where the storage case 23 is held between the cover 21 and the frame 22, the inflow port 23B of the working fluid communicates with the inflow port 22A of the working fluid which is provided at the frame 22 and the working fluid L from the liquid pipe 4 which is attached to the inflow port 22A flows into the storage part 23C as illustrated by the solid line.

On the other hand, the lower case 20L is provided with a bottom plate 26 which is provided with a recessed part 27 forming an evaporation chamber (hereinafter referred to as the "evaporation chamber 27") and wick mounting columns 25 which are provided sticking out at the evaporation chamber 27. There are nine wick mounting columns 25. The center axes of the wick mounting columns 25 are aligned with the center axes of the nine column-shaped projecting parts 24B of the wick 24. The depth of the evaporation chamber 27 may be made about 3 mm, the diameters of the wick mounting columns 25 may be made φ9 mm, and the heights may be made 15 mm. Further, at one end of the bottom plate 26, there is an outflow port 29 which is connected to the evaporation chamber 27. The vapor pipe 5 is connected to the outflow port 29. In the present embodiment, the wick mounting columns 25 and the bottom plate 26 are made of copper with good thermal conductivity. Further, the bottom plate 26 is attached on the heat generating member 8 with thermal grease 9 interposed.

The wick 24 may be made a porous PTFE (polytetrafluoroethylene) resin sintered body with a porosity of 40% and an average value of pore diameters of 20 μm. Further, at the back surface of the projecting parts 24B of the wick 24, recessed parts 24A in which the wick mounting columns 25 which are provided sticking out from the bottom plate 26 are inserted are provided. The recessed parts 24A, as will be understood from FIG. 12B which illustrates a cross-section along the line B-B which is illustrated in FIG. 12A, are shaped provided with grooves 24C at equal intervals in their inner circumferential surfaces into which the wick mounting columns 25 are inserted. The inside diameters of the inner circumferential surfaces of the recessed parts 24A may be made φ9 mm, the depths 12 mm, and the outside diameters of the projecting parts of the wick 24 φ13 mm. Therefore, in the state with the wick mounting columns 25 inserted into the recessed parts 24A of the wick 24, the surface of the wick 24 at the bottom plate side becomes positioned on the same plane as the end face 26A of the bottom plate 26.

Figure 12B:
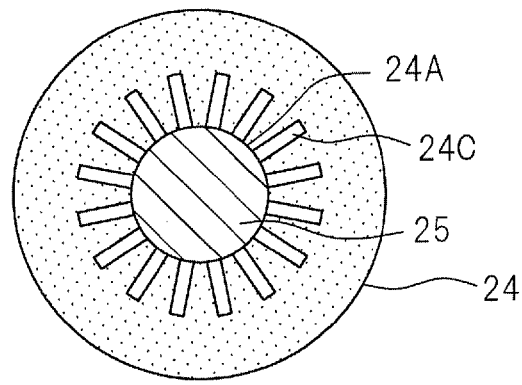
FIG. 12B is a cross-sectional view along the line B-B of FIG. 12A.

The grooves 24C, for example, may be uniformly provided at the inner circumferential surfaces of the recessed parts 24A with widths of 1 mm, depths of 1 mm, and a pitch of 2 mm in a direction vertical to the bottom plate 26. With this configuration, the thicknesses from the bottom surfaces of the grooves 24C to the outer circumferential surfaces of the projecting parts 24B of the wick 24 are uniform. However, the grooves 24C at the inner circumferential surfaces of the recessed parts 24A of the wick 24 which is illustrated in FIG. 12B are drawn by dimensions different from the above-mentioned dimensions so as to exaggeratedly illustrate the shapes of the recessed parts 24A of the wick 24. Further, the inside diameters of the inner circumferential surfaces of the recessed parts 24A in which the wick mounting columns 25 are inserted may be fabricated to be equal to the outside diameter dimensions of the wick mounting columns 25 or 50 to 200 μm or so smaller so as to obtain sufficient fit with the wick mounting columns 25.

Figure 12C:
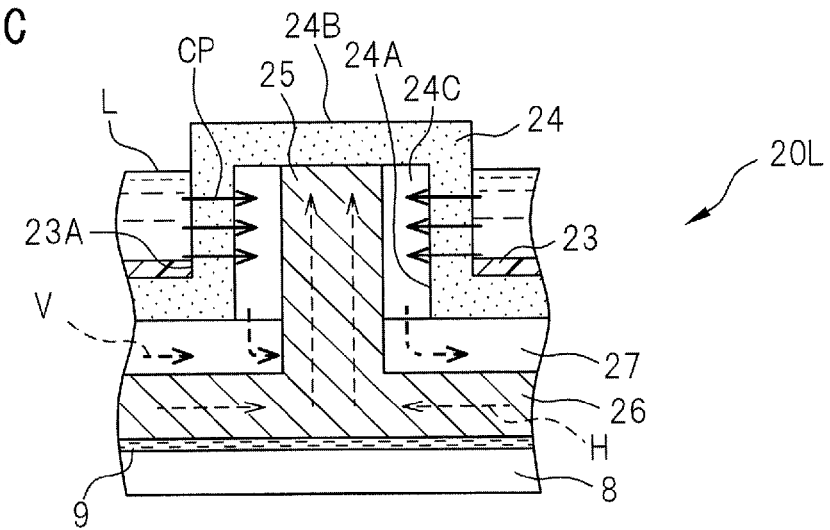
FIG. 12C is an explanatory view which explains movement of a working fluid in FIG. 12A.

Here, FIG. 12C will be used to explain the operation of the evaporator 20 of the second embodiment. In the evaporator 20 of the second embodiment, the working fluid L which flows from the liquid pipe 4 to the storage part 23C of the storage case 23 collects uniformly around the projecting parts 24B of the wick 24 whereby in permeates along the outer circumference surfaces of the projecting parts 24B of the wick 24. If the heat generating member 8 generates heat, the heat is transferred to the wick mounting columns 25 as illustrated by the broken line H and the wick mounting columns 25 rise in temperature. The working fluid L at the outside of the projecting parts 24B of the wick 24, as illustrated by the arrows CP, permeate through the wick 24 by the capillary phenomenon and seep out to the grooves 24C. The working fluid L which seeps out to the grooves 24C is heated by the heat of the wick mounting columns 25 to become vapor V which collects at the evaporation chamber 27. As explained above, the thicknesses from the bottom surfaces of the grooves 24C to the outer circumferential surfaces of the projecting parts 24B of the wick 24 are uniform, so the distances of permeation of the working fluid L become uniform. The vapor V of the working fluid which collects at the evaporation chamber 27 passes through the outflow port 29 and is discharged from the vapor pipe 5.

In the structure of the evaporator 20 of the second embodiment, when the working fluid L permeates through the wick 24, then becomes a vapor V which collects at the evaporation chamber 27, since the distances of permeation from the projecting parts 24B of the wick 24 to the metal surfaces (wick mounting columns 25) are the same, partial drying hardly ever occurs at the wick 24. Further, the areas around the projecting parts 24B of the wick 24 form a continuous structure in the same plane, so the projecting parts 24B are uniformly supplied with working fluid. That is, the bottommost parts of the wick 24 are closest to the bottom surface of the evaporator 20 and easily become high in temperature, but the wick 24 reliably permeates the working fluid L, so it is possible to completely prevent partial drying or dry out of the wick 24. For this reasons, it is possible to realize more highly reliable operability.

Figure 13:
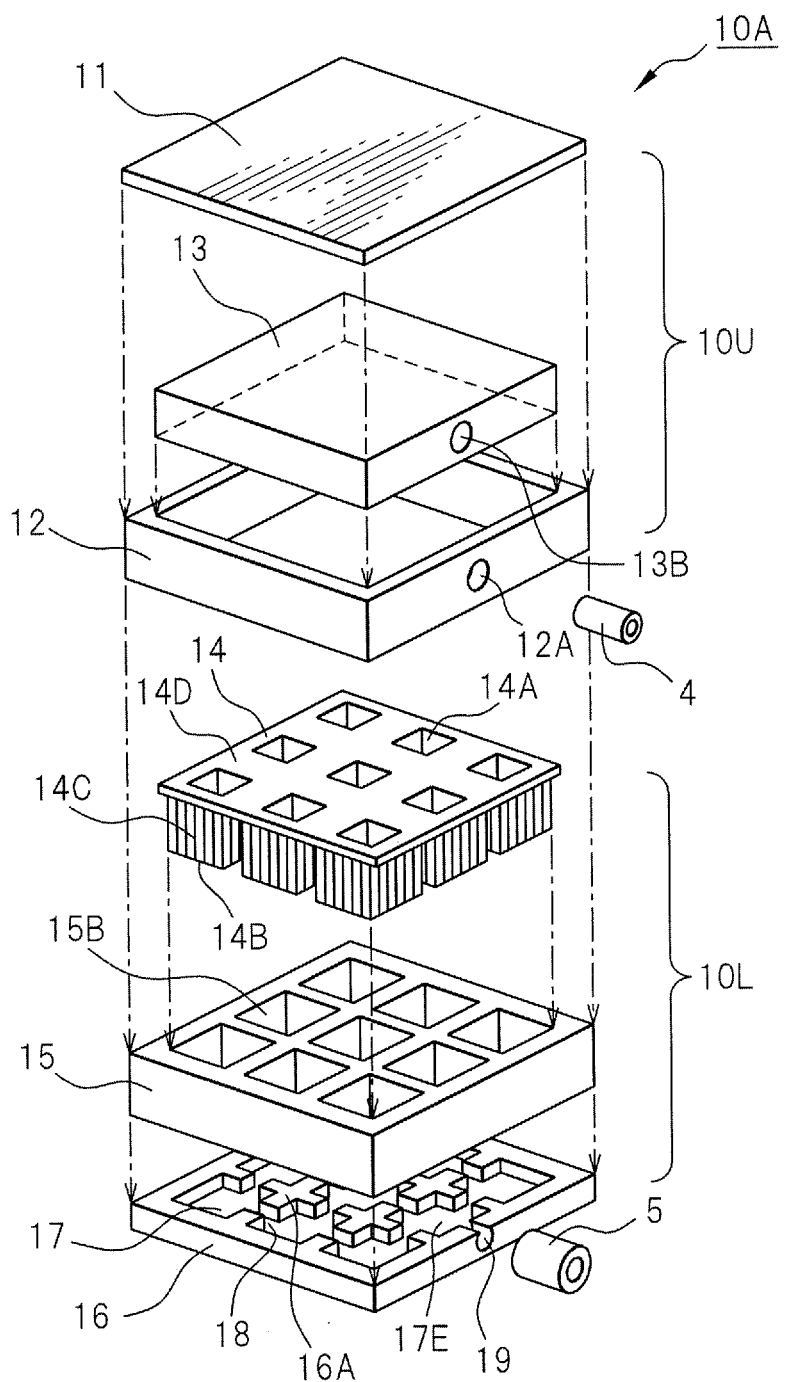
FIG. 13 is a disassembled perspective view which illustrates a third embodiment of an evaporator of a loop type heat pipe of the present application.

In the second embodiment, ethanol was used as the working fluid. An experiment was conducted which used a loop type heat pipe using an evaporator 20 of the second embodiment to cool an electronic device (CPU) in an operating electronic equipment. As a result, it was learned that even in a state where the electronic device is operating at maximum speed and the amount of heat generation is about the maximum 150 W, the junction temperature was held at 55° C. or less and good cooling was possible. Further, it was learned that under all conditions, including the state where the electronic equipment is operating at full capacity, the wick 24 in the evaporator 20 will not dry out, the electronic device will not become an abnormally high temperature, and stable cooling performance is obtained. In this way, in a cooling device using a loop type heat pipe which has a thin type, plate-shaped evaporator 20 of the second embodiment, a high heat generating member will be efficiently cooled and the electronic equipment or computer becomes higher in performance, FIG. 13 is a disassembled perspective view which illustrates an evaporator 10A of a third embodiment of the loop type heat pipe of the present application. The component members of the evaporator 10A of the third embodiment are almost the same as the component members of the evaporator 10 of the first embodiment which was explained from FIG. 2 to FIG. 6. Accordingly, the same component members are assigned the same reference notations and their explanations are omitted.

Figure 14A:
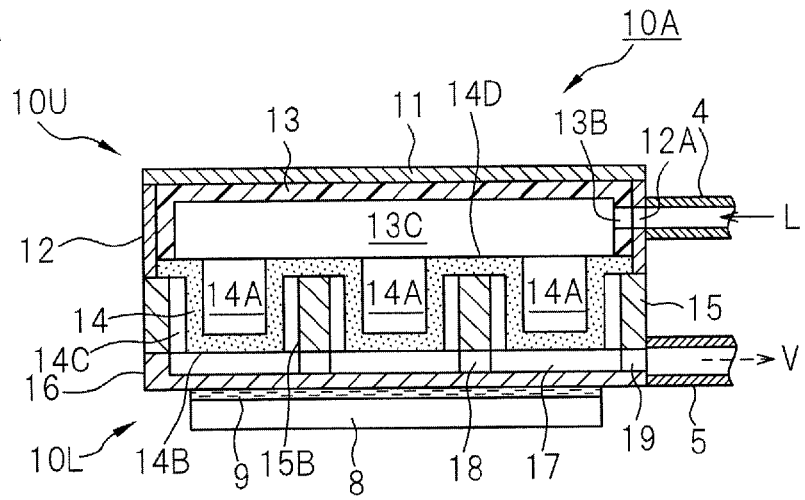
FIG. 14A is a cross-sectional view which illustrates a state where the evaporator which is illustrated in FIG. 13 is placed on a heat generating member.

In the structure of the evaporator 10A of the third embodiment, the only point of difference from the structure of the evaporator 10 of the first embodiment is the structure of the storage case 13. The storage case 13 in the evaporator 10 of the first embodiment is provided with discharge ports 13A of working fluid at positions corresponding to the nine recessed parts 14A at the flat part 14D of the wick 14 at the bottom surface 13D. On the other hand, in the evaporator 10A of the third embodiment, the storage case 13 has no bottom surface 13D. As illustrated in FIG. 14A, the surface which faces the wick 14 is completely open. Therefore, the working fluid which flows into the storage case 13 flows over the flat part 14D of the wick 14 and flows into the recessed parts 14A.

Figure 14B:
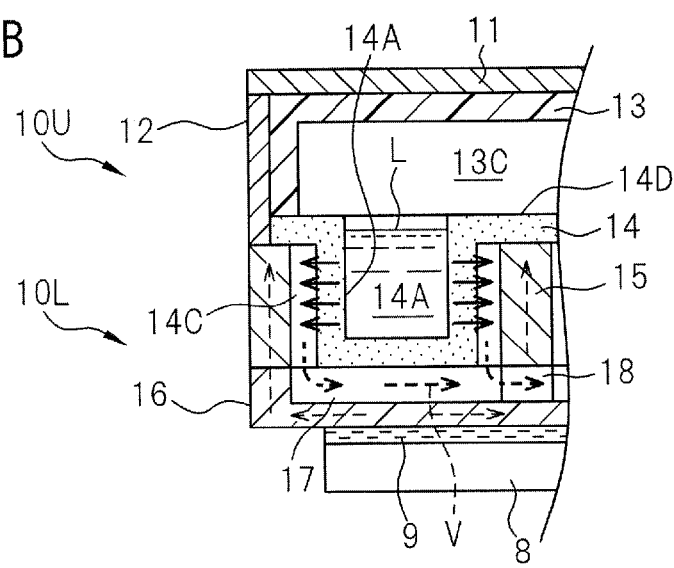
FIG. 14B is an explanatory view which explains movement of a working fluid in FIG. 14A.

FIG. 14B is an explanatory view which explains the movement of the working fluid in FIG. 14A. In the evaporator 10A of the third embodiment as well, the working fluid L which flows in from the liquid pipe 4 to the storage part 13C of the storage case 13 flows over the flat part 14D of the wick 14 and is distributed to the insides of the recessed parts 14A. If the heat generating member 8 generates heat, the heat is transferred to the wick case 15 as illustrated by the broken line and the lower case 10L rises in temperature. Due to the rise in temperature of the lower case 10L, the working fluid L in the recessed parts 14A of the wick 14 permeates through the wick 15 by the capillary phenomenon as illustrated by the capillary phenomenon and seeps out to the grooves 14C. The working fluid L which seeps out to the grooves 14C is heated by the heat of the wick case 15 to become the vapor V which collects in the evaporation chambers 17. The vapor V of the working fluid which collects in the evaporation chambers 17 flows through the connecting holes 18, collects at the evaporation chamber 17E which is positioned at the end of the evaporator 10 which is illustrated in FIG. 4, and passes through the outflow port 19 to be discharged from the vapor pipe 5.

In the structure of the evaporator 10A of the third embodiment, before the working fluid L flows into the recessed parts 14A of the wick 14, it passes over the flat part 14D of the wick 14. At this time, the working fluid L permeates slightly into the flat part 14D of the wick 14, so in the structure of the evaporator 10A of the third embodiment, partial drying of the flat part 14D of the wick 14 hardly ever occurs.

Figure 14C:
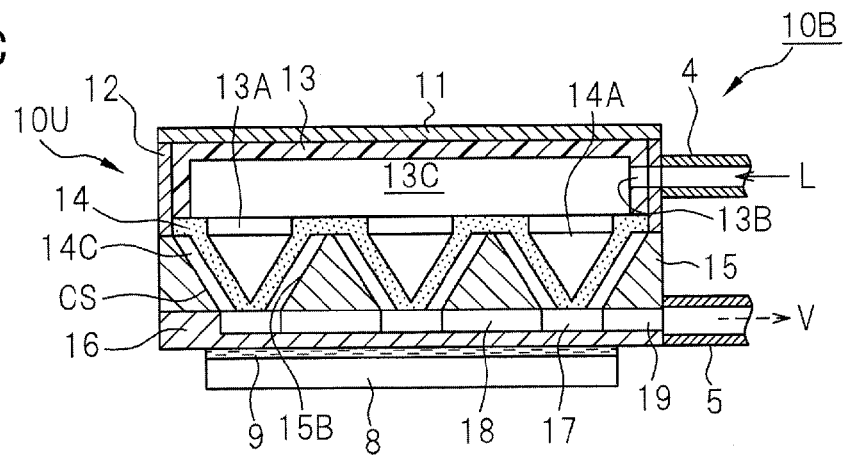
FIG. 14C is a cross-sectional view which illustrates an evaporator of a cooling device which uses a loop type heat pipe of a modified embodiment of the third embodiment.

For the structure of the evaporator 10A of the third embodiment, the structure which is illustrated in FIG. 13C similar to the evaporator 10B of the modified embodiment which is explained in FIG. 7B is possible. That is, as illustrated in FIG. 14C, an evaporator 10B of a modified embodiment which further increases the slant of the contact surfaces CS with the wick case 15 of the wick 14 is possible. The structure of the evaporator 10B which is illustrated in FIG. 14C differs from the structure of the evaporator 10A which is illustrated, in FIG. 14A in only the shape of the wick 14. The explanation of the different parts is the same as with FIG. 7B, so the same members are assigned the same reference notations and their explanations are omitted.

Figure 15:
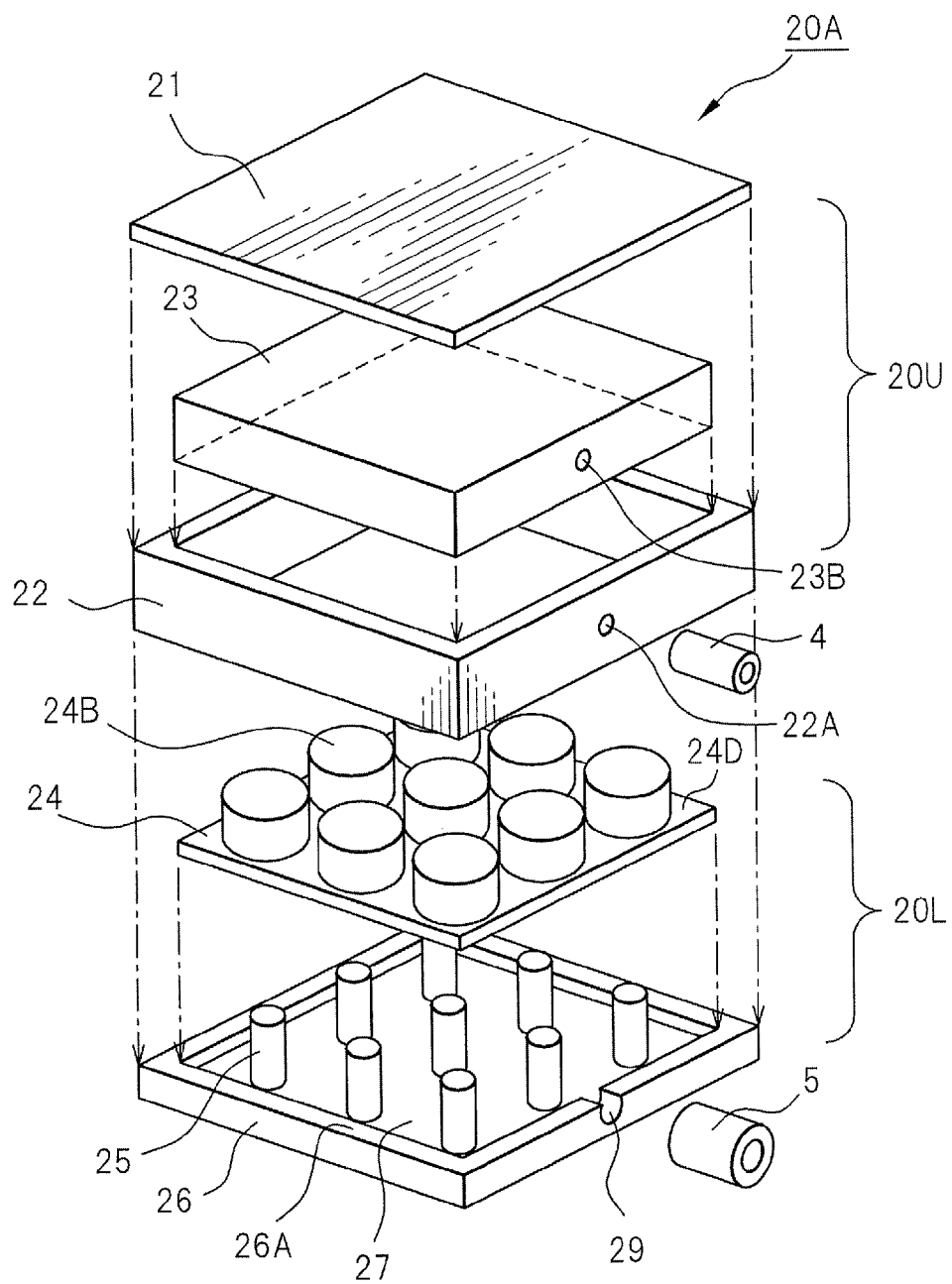
FIG. 15 is a disassembled perspective view which. illustrates a fourth embodiment of an evaporator of a loop type heat pipe of the present application.

FIG. 15 is a disassembled perspective view which illustrates an evaporator 20A of a fourth embodiment of a loop type heat pipe of the present application. The component members of the evaporator 20A of the fourth embodiment are almost the same as the component members of the evaporator 20 of the second embodiment which is explained from FIG. 9 to FIG. 12. Accordingly, the same component members are assigned the same reference notations and their explanations are omitted.

Figure 16A:
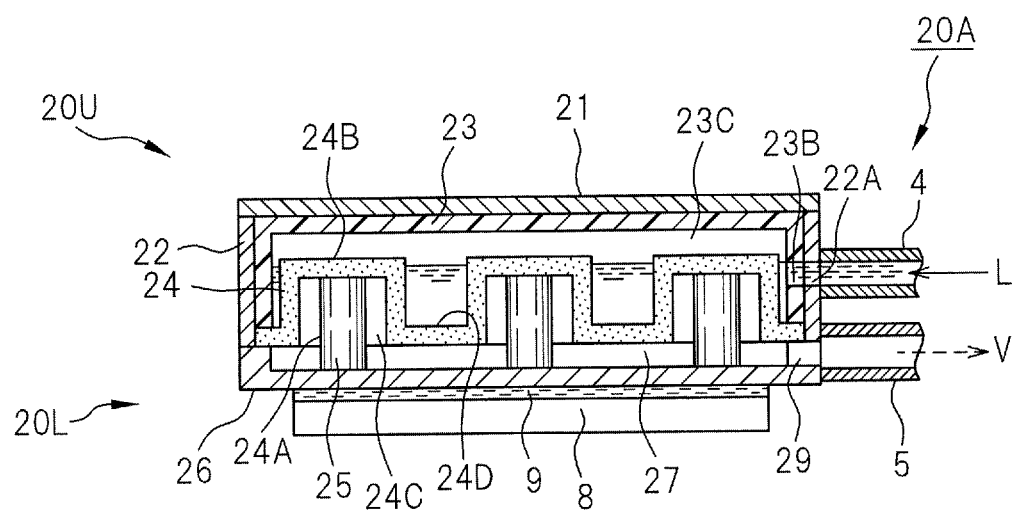
FIG. 16A is a cross-sectional view which illustrates a state where the evaporator which is illustrated in FIG. 15 is placed on a heat generating member.

In the structure of the evaporator 20A of the fourth embodiment, the only point of difference from the structure of the evaporator 20 of the second embodiment is the structure of the storage case 23. The storage case 23 in the evaporator 20 of the second embodiment is provided with discharge openings 23A of the working fluid corresponding to the projecting parts 24B of the wick 24 at its bottom surface 23D. On the other hand, in the evaporator 20A of the fourth embodiment, the storage case 23 has no bottom surface 23D. As illustrated in FIG. 16A, the surface facing the wick 24 is completely open. Therefore, the working fluid which flows into the storage case 23 contacts the side surfaces of the projecting parts 24B of the wick 24 and contacts the flat part 24D around the projecting parts 24B of the wick 24.

Figure 16B:
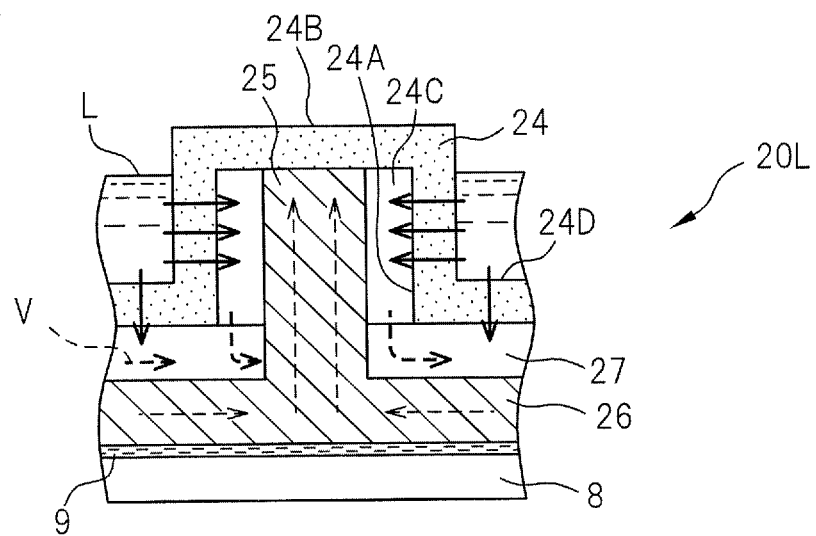
FIG. 16B is an explanatory view which explains movement of a working fluid in FIG. 16A.

FIG. 16B is an explanatory view which explains movement of the working fluid L in FIG. 16A. In the evaporator 20A of the fourth embodiment as well, the working fluid L which flows in from the liquid pipe 4 to the storage part 23C of the storage case 23 uniformly collects around the projecting parts 24B of the wick 24 and permeates to the outer circumferential surfaces of the projecting parts 24B and flat part 24D of the wick 24. If the heat generating member 8 generates heat, the heat is transferred to the wick mounting columns 25 as illustrated by the broken line. Due to the temperature rise of the wick mounting columns 25, the working fluid L at the outsides of the projecting parts 24B of the wick 24 permeates through the wick 24 and seeps out to the grooves 24V by the capillary phenomenon as illustrated by the arrows. The working fluid L which seeps out to the grooves 24C becomes vapor V by the heat of the wick mounting columns 25 and collects at the evaporation chamber 27. The thicknesses from the bottom surfaces of the grooves 24C to the outer circumferential surfaces of the projecting parts 24B of the wick 24 are uniform, so the distances of permeation of the working fluid L are equal. The vapor V of the working fluid which collects at the evaporation chamber 27 is ejected through the outflow port 29 from the vapor pipe 5.

In the structure of the evaporator 20A of the fourth embodiment, the working fluid L permeates to the flat part 24D of the wick 24 as well and collects at the evaporation chamber 27, so partial drying of the flat part 24D of the wick 24 hardly ever occurs. Further, the areas around the projecting parts 24B of the wick 24 form a continuous structure in the same plane, so the projecting parts 24B are uniformly supplied with working fluid. That is, the bottom part and flat part 24D of the wick 24 are the closest to the bottom surface of the evaporator 20 and easily become high in temperature, but the wick 24 is reliably impregnated with the working fluid L, so partial drying and dry out of the wick 24 is completely prevented. For this reason, more highly reliable operability is possible to be realized.

As explained above, according to the evaporator of a loop type heat pipe of the present application, the distances of permeation to the metal surface inside of the recessed parts of the wick or the porous members of the projecting parts become uniform, so partial drying of the wick hardly ever occurs and "dry out" where the wick dries out will never occur. Further, in the temperature distribution of the wick, the parts near the evaporator bottom surface become high in temperature, so the working fluid evaporates in a large amount from the tip of the wick close to the evaporator bottom surface, but according to the evaporator structure of the present application, the tip of the wick is positioned at the lowest point ac the liquid chamber side, so the tip of the wick is most easily supplied with working fluid.

Furthermore, by using an elastic plastic porous member for the wick, it is possible obtain a structure in which the side surfaces of the wick are in close contact with the recessed part of the evaporator bottom surface or the side surfaces of the projecting parts, so it is possible to efficiently transfer the heat of the bottom surface of the evaporator to the wick and possible to realize a high cooling performance. In this way, in the cooling device using a loop type heat pipe which uses the evaporator structure of the present application, at the time of high heat generation of a heat generating component, it is possible to obtain a stable cooling performance without a drop in the amount of heat generation of the evaporator.

Figure 17:
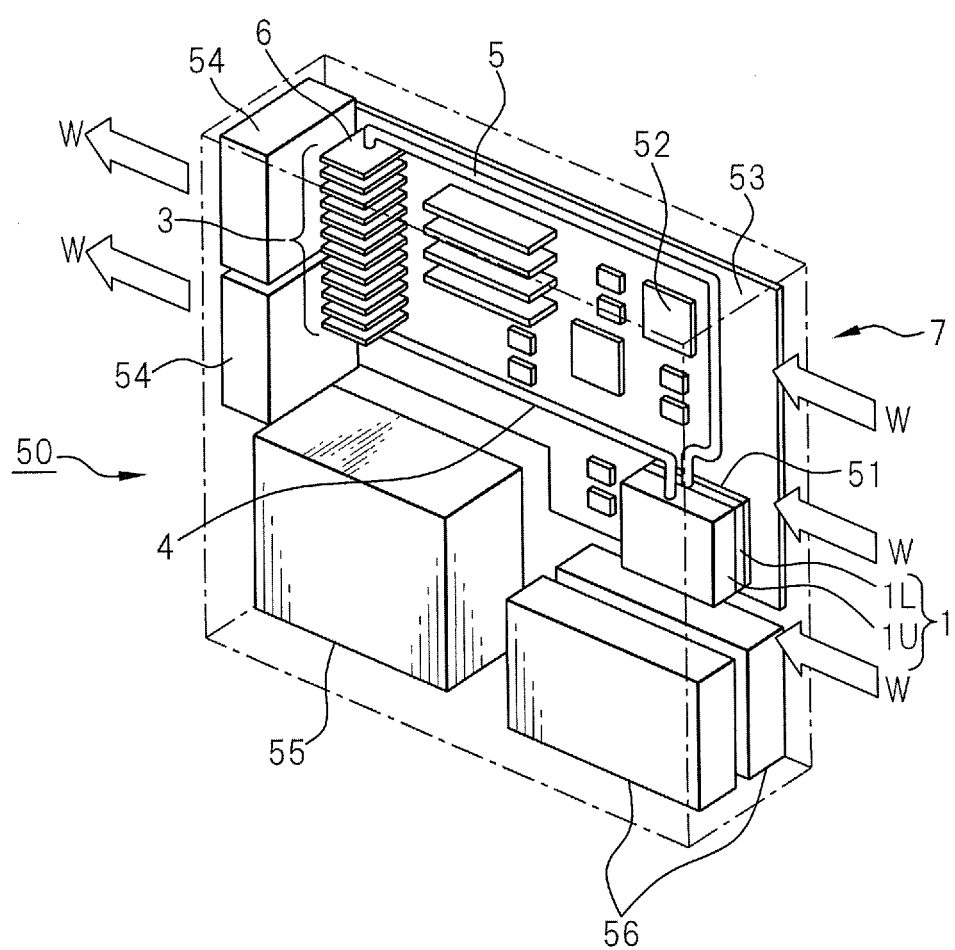
FIG. 17 is a perspective view in the case where a computer in which a cooling device using a loop type heat pipe of one embodiment of the present application is assembled is arrant standing up vertically.

In this regard, the computer 50 which is illustrated in FIG. 1 is generally used in a state laid flat (laid horizontally) but due to the space restrictions on a desk, the computer 50 is sometimes used in a state arranged standing up vertically as illustrated in FIG. 17. In such a case, in the above-mentioned evaporators of the first to fourth embodiments, at the time of low heat generation where the inside of the evaporator is not filled with working fluid, a state ends up occurring where the wick is not sufficiently supplied with working fluid. This issue will be explained using FIG. 18 using the third and fourth embodiments as examples.

FIG. 18A is a cross-sectional view which illustrates the state of use of the evaporator 10A of the third embodiment which is illustrated in FIG. 14A in the state of use which is illustrated in FIG. 17. If the computer 50 is arranged standing up vertically, the evaporator 10A is also arranged standing up vertically, so at the time of low heat generation where the inside of the evaporator is not filled with the working fluid, the working fluid L collects at the bottom part of the storage part 13C of the evaporator 10A and a part is formed where working fluid L is not supplied at the top part of the evaporator 10A. For this reason, it becomes difficult to supply working fluid to the top end part of the wick 14 and dry out easily occurs at the wick. This issue, as illustrated in FIG. 18B, is the same even in the case where the evaporator 20A of the fourth embodiment which is illustrated in FIG. 16A is arranged standing up vertically.

To deal with this issue, in the present application, by providing separators inside of the evaporators of the first to fourth embodiments, even if the evaporator is arranged standing up, the working fluid which is filled inside of the evaporator is evenly supplied to the wick inside of the evaporator. Several embodiments in which separators are provided inside the evaporators will be explained using FIG. 19 to FIG. 21.

FIG. 19A illustrates an evaporator 10C of a fifth embodiment of a loop type heat pipe of the present application. The evaporator 10C of the fifth embodiment comprises the evaporator 10A of the third embodiment which is illustrated in FIG. 14A inside of which a separator 61 is provided. The rest of the configuration other than the separator 61 is the same as the evaporator 10A of the third embodiment, so the same members are assigned the same reference notations and their explanations are omitted. The separator 61 is a flat plate shape, is attached inside of the storage case 13 in parallel to the cover 11, and divides the storage part of the working fluid into a first storage part 13C1 and a second storage part 13C2. The separator 61 is provided inside of the storage case 13 so that the first storage part 13C1 is positioned immediately below the inflow port 13B of the working fluid L from the liquid pipe 4 at the storage case 13 at the time when the evaporator 10C is arranged standing up vertically. The total length of the separator 61 in the vertical direction is smaller than the inner dimension of the storage case 13 in the vertical direction, so at the top end of the separator 61, a connecting space 13C3 is provided which connects the first storage part 13C1 and the second storage part 13C2. Due to the connecting space 13C3, the working fluid L moves between the first storage part 13C1 and the second storage part 13C2. Further, at the bottom end part of the separator 61, a fine hole 61A is provided which connects the first storage part 13C1 and the second storage part 13C2.

If the above configured evaporator 10C is arranged standing up vertically, the working fluid L which passes through the liquid pipe 4 and flows in from the inflow port 13B to the inside of the storage case 13 collects inside the first storage part 13C1 partitioned by the separator 61. The volume of the first storage part 13C1 is smaller than the storage case 13 as a whole, so even at the time of low heat generation where the inside of the evaporator is not filled with working fluid, the working fluid L fills the first storage part 13C1. For this reason, all of the wick 14 is supplied with working fluid L from the first storage part 13C1 and the wick 14 not longer suffers dry out. Note that, after the first storage part 13C1 is filled full with the working fluid L, the working fluid overflows from the first storage part 13C1 and collects at the second storage part 13C2. The evaporator 10C of the fifth embodiment is provided with the connecting space 13C3 which connects the first storage part 13C1 and the second storage part 13C2, so in the state where the computer is laid flat horizontally, the evaporator operates in the same way as the evaporator 10A of the third embodiment.

FIG. 19B illustrates an evaporator 20C of a sixth embodiment of the loop type heat pipe of the present application. The evaporator 20C of the sixth. embodiment provides a separator 62 inside of the evaporator 20A of the fourth embodiment which is illustrated in FIG. 16A. The rest of the configuration other than the separator 62 is the same as the evaporator 20A of the fourth embodiment, so the same members are assigned the same reference notations and their explanations are omitted. The separator 62, as illustrated in FIG. 19C, is a flat plate shape and is provided with circular holes 62A and semicircular recessed parts 62B equal to the outer shapes of the wick 24 at positions corresponding to the wick 24. The separator 62, in the state where the evaporator 20C is arranged standing up vertically, is attached inside of the storage case 23 parallel to the cover 21 in the state with circular holes 62A fit over the bottom sides of the wick 24 and with the semicircular recessed parts 62B fit over the bottom sides of the topmost stage of the wick 24.

The mounting position of the separator 62 is at the side close to the front ends of the projecting parts 24B of the wick 24. The separator 62 is used to divide the storage part of the working fluid into the first storage part 23C1 and the second storage part 23C2. Further, the separator 62 is provided inside of the storage case 23 so that the first storage part 23C1 is positioned directly under the inflow port 23B of the working fluid L from the liquid pipe 4 in the storage case 23 when the evaporator 20C is arranged standing up vertically. The total length of the separator 62 in the vertical direction is smaller than the inner dimension of the storage case 23 in the vertical direction. At the top end. of the separator 62, therefore, a connecting space 23C3 which connects the first storage part 23C1 and the second storage part 2302 is provided to enable movement of working fluid L.

If the thus configured evaporator 20C is arranged standing up vertically, the working fluid L which passes through the liquid pipe 4 and flows from the inflow port 23B to the inside of the storage case 23 collects inside the first storage part 23C1 which is formed by partitioning by the separator 62. The volume of the first storage part 23C1 is smaller than the volume of the storage case 23 as a whole, so even at the time of low heat generation when the inside of the evaporator is not filled with the working fluid, the working fluid L fills the first storage part 23C1. For this reason, all of the wick 24 is supplied with working fluid L from the first storage part 23C1 and the wick 24 no longer suffers from dry out. Note that, after the first storage part 23C1 is filled full with the working fluid L, the working fluid overflows from the first storage part 23C1 and collects at the second storage part 23C2. The evaporator 20C of the sixth embodiment is provided with a connecting space 23C3 which connects the first storage part 23C1 and the second storage part 23C2, so in the state where the computer is laid flat horizontally, the evaporator operates in the same way as the evaporator 20A of the fourth embodiment.

FIG. 20A illustrates an evaporator 10D of a seventh embodiment of a loop type heat pipe of the present application. The evaporator 10D of the seventh embodiment provides separators 71 inside of the evaporator 10A of the third embodiment which is illustrated in FIG. 14A. The rest of the configuration other than the separators 71 is the same as the evaporator 10A of the third embodiment, so the same members are assigned the same reference notations and their explanations are omitted. The separators 71 are flat plate shapes which are arranged inside the storage case 13 at a slant by being made to tilt upward at a boundary part of the first stage and second stage and a boundary part of the second stage and third stage of the recessed parts 14A of the wick arranged in the horizontal direction. The separators 71 are provided inside of the storage case 13 so that the separators 71 are positioned directly under the inflow port 13B of the working fluid L from the liquid pipe 4 at the storage case when the evaporator 10D is arranged standing up vertically. The first storage part 13C1 is a part which is formed by the separator 71 and has working fluid L collected in it. The remaining space of the storage case 13 is the second storage part 13C2.

If the thus configured evaporator 10D is arranged standing up vertically, the working fluid L which flows through the liquid pipe 4 from the inflow port 13B to the inside of the storage case 13 is received by the separator 71 at the topmost stage and collects inside the first storage part 13C1. The volume of the first storage part 13C1 is small, so the inside of the topmost stage first storage part 13C1 immediately becomes filled with the working fluid L and the overflowing working fluid L collects at the second first storage part 13C1. The volume of the second first storage part 13C1 is also small, so the inside of the second first storage part 13C1 also immediately becomes filled with the working fluid L and the overflowing working fluid L collects at the bottom part of the storage case 13. For this reason, all of the stages of the wick 14 are supplied with working fluid L and the wick 14 no longer suffers from dry out. In the evaporator 10D of the seventh embodiment, the first storage part 13C1 and the second storage part 13C2 are connected, so in the state where the computer is laid flat horizontally, the evaporator operates in the same way as the evaporator 10A of the third embodiment.

FIG. 20B illustrates an evaporator 20D of an eighth embodiment of a loop type heat pipe of the present application. The evaporator 20D of the eighth embodiment is provided with separators 72 inside of the evaporator 20A of the fourth embodiment which is illustrated in FIG. 16A. The rest of the configuration other than the separators 72 is the same as the evaporator 20A of the fourth embodiment, so the same members are assigned the same reference notations and their explanations are omitted. The separators 72, as illustrated in FIG. 20C, are flat plate shapes, are bent to the top side at the ends at the wick 24 side, and are provided with semicircular recessed parts 72A at the bent parts. The separators 72, in the state where the evaporator 20D is arranged sanding up vertically, are attached at a slant with the flat plate parts tilted upward with the semicircular recessed parts 72A fit over the bottom sides of the topmost stage and second stage wicks 24. The separators 72 are provided inside of the storage case 23 so that they are positioned right under the inflow port 23B of the working fluid L from the liquid pipe 4 at the storage case when the evaporator 20D is arranged standing up vertically. The first storage part 23C1 is a part which is formed by a separator 72 where the working fluid L collects. The remaining space of the storage case 23 is the second storage part 23C2.

If the thus configured evaporator 20D is arranged standing up vertically, the working fluid L which flows through the liquid pipe 4 from the inflow port 23B to the inside of the storage case 23 is received by the separator 72 at the topmost stage and collects inside the first storage part 23C1. The volume of the first storage part 23C1 is small, so the inside of the topmost stage first storage part 23C1 immediately becomes filled with the working fluid L and the overflowing working fluid L collects at the second first storage part 23C1. The volume of the second first storage part 23C1 is also small, so the inside of the second first storage part 23C1 also immediately becomes filled with the working fluid L and the overflowing working fluid L collects at the bottom part of the storage case 23. For this reason, all of the stages of the wick 24 are supplied with working fluid L and the wick 24 no longer suffers from dry out. In the evaporator 20D of the second embodiment, the first storage part 23C1 and the second storage part 23C2 are connected, so the evaporator 20A of the fourth embodiment operates in the same way in the state where the computer is laid flat horizontally.

Figure 21A:
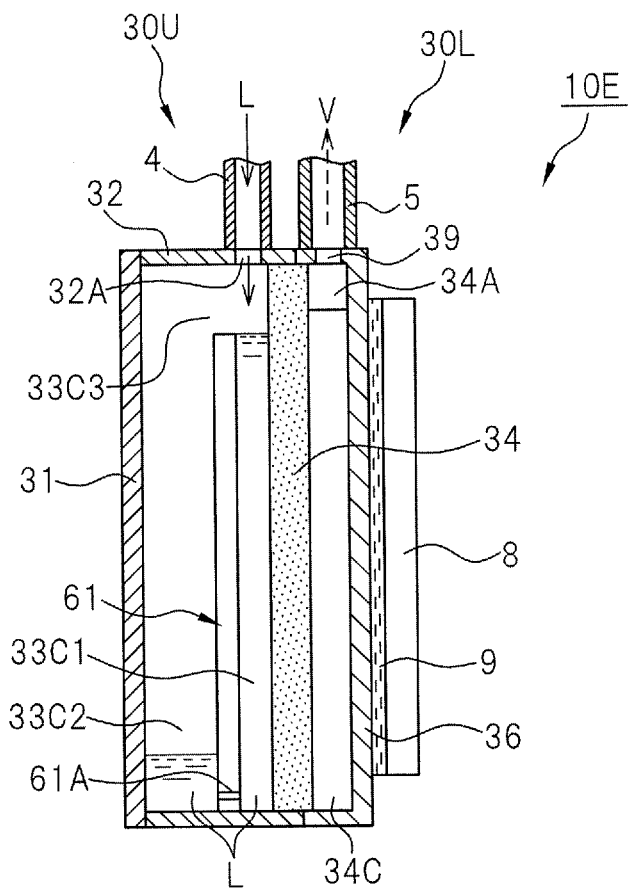
FIG. 21A is a cross-sectional view which illustrates a ninth embodiment of an evaporator of a cooling device which uses a loop type heat pipe of the present application.
Figure 21B:
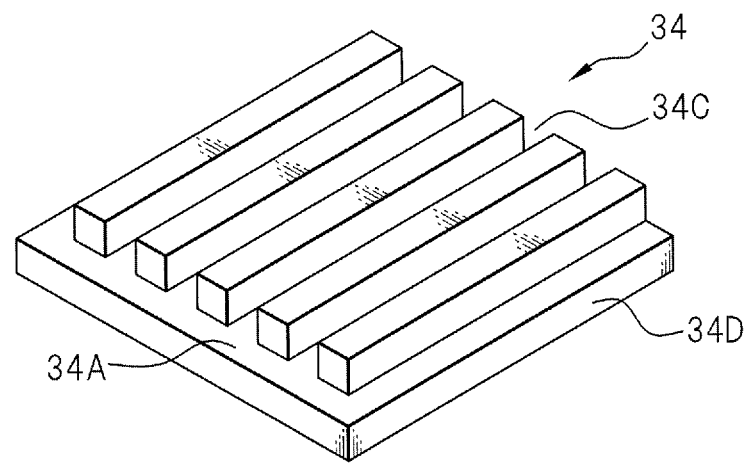
FIG. 21B is a perspective view of a wick which is used in FIG. 21A.

FIG. 21A illustrates an evaporator 10E of a ninth embodiment of a loop type heat pipe of the present application, while FIG. 21B is a perspective view of a wick 34 which is used in FIG. 21A. The structure of the evaporator 10E of the ninth embodiment differs from the structures of the evaporators of the first to eighth embodiments. The evaporator 10E of the ninth embodiment is provided with a cover 31, frame 32, and bottom plate 36. The liquid pipe 4 and the vapor pipe 5 are connected to the side surface of the frame 32. FIG. 21A illustrates the state where the evaporator 10E is arranged standing up vertically. In this state, the wick 33 which is provided with the connecting space 34A and the grooves 34C such as illustrated in FIG. 21B is attached to the frame 32 so that the connecting space 34A adjoins the outflow port 39. Further, inside of the frame 32, a separator 61 similar to the seventh embodiment is provided. The configuration of the separator 61 is similar to that of the seventh embodiment, so the same reference notations are assigned and further explanation is omitted. Note that, in the evaporator 10E of the ninth embodiment, the description of the storage case is omitted, but a storage case may also be provided inside of the cover 23 in the same way as the first to the eighth embodiments.

If the evaporator 10E which was configured in the above way is arranged standing up vertically, the working fluid L which passes through the liquid pipe 4 from the inflow port 32A to the inside of the evaporator 10E collects inside the first storage part 33C1 formed by partitioning by the separator 61. The volume of the first storage part 33C1 is smaller than the volume of the evaporator 10E as a whole, so even at the time at low heat generation where the inside of the evaporator 10E is not filled with working fluid L, the working fluid L fills the first storage part 33C1. For this reason, working fluid L is supplied to the majority of the surface of the wick 34 from the first storage part 33C and dry out no longer occurs at the top part of the wick 34. The working fluid L which permeates through the wick 34 and seeps out to the insides of the grooves 34C becomes the vapor V due to the heat from the bottom plate 36 and flows from the outflow port 39 to the vapor pipe 5. Note that after the first storage part 33C1 is filled with working fluid L, the working fluid L overflows from the first storage part 33C1 and collects in the second storage part 33C2. The evaporator 10E of the ninth embodiment is provided with a connecting space 33C3 which connects the first storage part 33C1 and the second storage part 33C2, so operates in the same way even if the computer is laid flat horizontally.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A cooling device which cools a heat generating member by a loop type heat pipe, said loop type heat pipe provided with:
   an evaporator with a built-in porous member,
   a condenser, and
   a liquid pipe and vapor pipe which connect the evaporator and the condenser in a loop shape,
   the evaporator of the cooling device characterized in that said evaporator is provided with a first case and a second case,
   said porous member is positioned between the first case and the second case;
   said liquid pipe is connected to the first case and said vapor pipe is connected to the second case on the same surface of said evaporator,
   a working fluid storage portion to which working fluid is supplied from said liquid pipe is provided between said porous member and a connecting portion of said liquid pipe in said first case;
   the first case is provided with a frame and a cover which seals an upper part of the frame, wherein the frame and the cover are formed by a material with a first thermal conductivity, and a plastic storage case arranged in a space formed by the frame and the cover as the working fluid storage portion which distributes and sends the working fluid which is supplied from the first case to a plurality of discharge ports which are provided at a bottom surface of the storage case,
   the second case is provided with a plate formed by a material with a second thermal conductivity, wherein the second thermal conductivity of the plate is higher than the first thermal conductivity of the frame and the cover, and the plate is equipped with a cavity on an upper face thereof and is provided with a plurality of columns which are sticking out from the cavity of the plate,
   the porous member is provided with a flat plate part comprising projecting parts which project out from a first case side of the flat plate part to be able to fit into the plurality of discharge ports, and recessed parts which are formed on a back side of each of the projecting parts, and the recessed parts and the projecting parts increase the permeation area of the working fluid which is sent from the first case to the second case, and
   the projecting parts of the porous member is projected into the storage case through the discharge ports, the columns sticking out from the cavity of the plate are inserted into the recessed part of the porous members, a back face of the plate becomes a heat receiving part which receives heat from the heat generating member, the columns sticking out from the cavity becomes a heating part which uses the received heat to vaporize the working fluid which seeps out from the porous member, and the cavity becomes a vapor collecting part which collects vapor of the working fluid and sends it to the vapor pipe, in the case with the first case superposed over the second case,
   and the vapor pipe is connected to the cavity.

2. The cooling device according to claim 1, wherein inner circumferential surfaces of said recessed parts are formed with pluralities of grooves which run from said first case side to said second case side, and the distances between bottom surfaces of said grooves and outer circumferential surfaces of said projecting parts are uniform.

3. The cooling device according to claim 2, wherein said recessed parts are columnar shaped, and said columnar parts which are inserted into said recessed parts are columns.

* * * * *